United States Patent
Takahashi et al.

(10) Patent No.: US 10,933,507 B2
(45) Date of Patent: Mar. 2, 2021

(54) POLISHING APPARATUS

(71) Applicant: EBARA CORPORATION, Tokyo (JP)

(72) Inventors: Taro Takahashi, Tokyo (JP); Akira Nakamura, Tokyo (JP); Hiroaki Shibue, Tokyo (JP); Mitsuo Tada, Tokyo (JP)

(73) Assignee: EBARA CORPORATION, Tokyo (JP)

(*) Notice: Subject to any disclaimer, the term of this patent is extended or adjusted under 35 U.S.C. 154(b) by 21 days.

(21) Appl. No.: 15/438,505

(22) Filed: Feb. 21, 2017

(65) Prior Publication Data

US 2017/0259394 A1 Sep. 14, 2017

(30) Foreign Application Priority Data

Feb. 23, 2016 (JP) .............................. JP2016-031970

(51) Int. Cl.
| | |
|---|---|
| *B24B 37/013* | (2012.01) |
| *B24B 37/20* | (2012.01) |
| *B24B 37/30* | (2012.01) |
| *H01L 21/304* | (2006.01) |
| *H01L 21/67* | (2006.01) |
| *H01L 21/66* | (2006.01) |

(52) U.S. Cl.
CPC ............ *B24B 37/013* (2013.01); *B24B 37/20* (2013.01); *B24B 37/30* (2013.01); *H01L 21/304* (2013.01); *H01L 21/67092* (2013.01); *H01L 22/14* (2013.01); *H01L 22/26* (2013.01)

(58) Field of Classification Search
CPC ....... B24B 37/013; B24B 37/30; B24B 37/20; H01L 21/304; H01L 21/67092; H01L 22/14; H01L 22/26

See application file for complete search history.

(56) References Cited

U.S. PATENT DOCUMENTS 5,559,428 A * 9/1996 Li ........................... G01B 7/10
 324/71.5
6,924,641 B1 8/2005 Hanawa et al.
(Continued)

FOREIGN PATENT DOCUMENTS

JP H01-151002 A 6/1989
JP 2005-517290 A 6/2005
(Continued)

OTHER PUBLICATIONS

U.S. Appl. No. 60/217,228, filed Jul. 10, 2000, Johansson et al.
U.S. Appl. No. 60/221,668, filed Jul. 27, 2000, Redeker et al.

*Primary Examiner* — Joseph J Hail
*Assistant Examiner* — Arman Milanian
(74) *Attorney, Agent, or Firm* — BakerHostetler

(57) ABSTRACT

An end-point detection sensor 50 detects an end point of polishing, the end-point detection sensor 50 being arranged in a polishing table 100. The end-point detection sensor 50 has a pot core. The pot core 60 has a bottom portion 61a, a magnetic core base portion 61b and a peripheral wall base portion 61c. The end-point detection sensor 50 has an exciting coil 62, and a detection coil 63. The back surface 101b of the polishing pad 101 has a space 30 which is arranged at a portion facing the polishing table 100 and houses a magnetic core extension portion 8 and a peripheral wall extension portion 11. The magnetic core extension portion 8 and the peripheral wall extension portion 11 extending to the space 30 are located in the space 30.

10 Claims, 20 Drawing Sheets

(56) References Cited

U.S. PATENT DOCUMENTS

| | | | | |
|---|---|---|---|---|
| 6,966,816 B2* | 11/2005 | Swedek | ................ | B24B 37/013 324/230 |
| 7,001,242 B2* | 2/2006 | Birang | ................ | B24B 37/013 451/11 |
| 7,074,109 B1* | 7/2006 | Bennett | ................ | B24B 37/013 257/E21.304 |
| 10,391,610 B2* | 8/2019 | Iravani | ................ | G01N 27/025 |
| 2002/0055192 A1* | 5/2002 | Redeker | ................ | B24B 37/013 438/8 |
| 2002/0077031 A1* | 6/2002 | Johansson | ................ | B24B 37/013 451/6 |
| 2003/0148706 A1 | 8/2003 | Birang et al. | | |
| 2003/0148721 A1* | 8/2003 | Birang | ................ | B24B 37/013 451/527 |
| 2003/0201769 A1* | 10/2003 | Hanawa | ................ | B24B 37/013 324/230 |
| 2003/0236055 A1* | 12/2003 | Swedek | ................ | B24B 37/013 451/8 |
| 2004/0002171 A1* | 1/2004 | Gotkis | ................ | B24B 1/005 438/5 |
| 2005/0024047 A1* | 2/2005 | Miller | ................ | B24B 37/013 324/231 |
| 2005/0136800 A1* | 6/2005 | Miller | ................ | B24B 37/013 451/5 |
| 2005/0173259 A1* | 8/2005 | Mavliev | ................ | B23H 5/08 205/645 |
| 2008/0020690 A1* | 1/2008 | Birang | ................ | B24B 37/013 451/548 |
| 2008/0242195 A1* | 10/2008 | Heinrich | ................ | B24B 37/013 451/6 |
| 2009/0058409 A1* | 3/2009 | Fujita | ................ | B24B 37/013 324/230 |
| 2009/0149115 A1* | 6/2009 | Palou-Rivera | ................ | B24B 37/042 451/5 |
| 2009/0256558 A1* | 10/2009 | Fujita | ................ | G01B 7/105 324/230 |
| 2010/0035516 A1* | 2/2010 | Takahashi | ................ | B24B 37/013 451/5 |
| 2010/0124792 A1* | 5/2010 | Iravani | ................ | B24B 37/013 438/17 |
| 2011/0068807 A1* | 3/2011 | Kesil | ................ | G01N 27/023 324/633 |
| 2011/0124269 A1* | 5/2011 | Tada | ................ | B24B 37/013 451/5 |
| 2011/0189856 A1* | 8/2011 | Xu | ................ | B24B 37/013 438/692 |
| 2012/0245724 A1* | 9/2012 | Erturk | ................ | H01L 22/14 700/108 |
| 2012/0293188 A1* | 11/2012 | Nikolenko | ................ | G01B 7/06 324/655 |
| 2013/0260645 A1* | 10/2013 | Takahashi | ................ | G01N 27/90 451/8 |
| 2014/0127971 A1* | 5/2014 | Xu | ................ | B24B 7/228 451/5 |
| 2015/0118766 A1* | 4/2015 | Xu | ................ | H01L 22/14 438/10 |
| 2015/0151400 A1* | 6/2015 | Sakata | ................ | B24B 37/013 451/5 |
| 2015/0262893 A1* | 9/2015 | Nakamura | ................ | H01L 22/26 438/10 |

FOREIGN PATENT DOCUMENTS

| | | |
|---|---|---|
| JP | 2007-501509 A | 1/2007 |
| JP | 2009-076922 A | 4/2009 |
| JP | 2009-186433 A | 8/2009 |
| JP | 2012-135865 A | 7/2012 |
| JP | 2013-058762 A | 3/2013 |

* cited by examiner

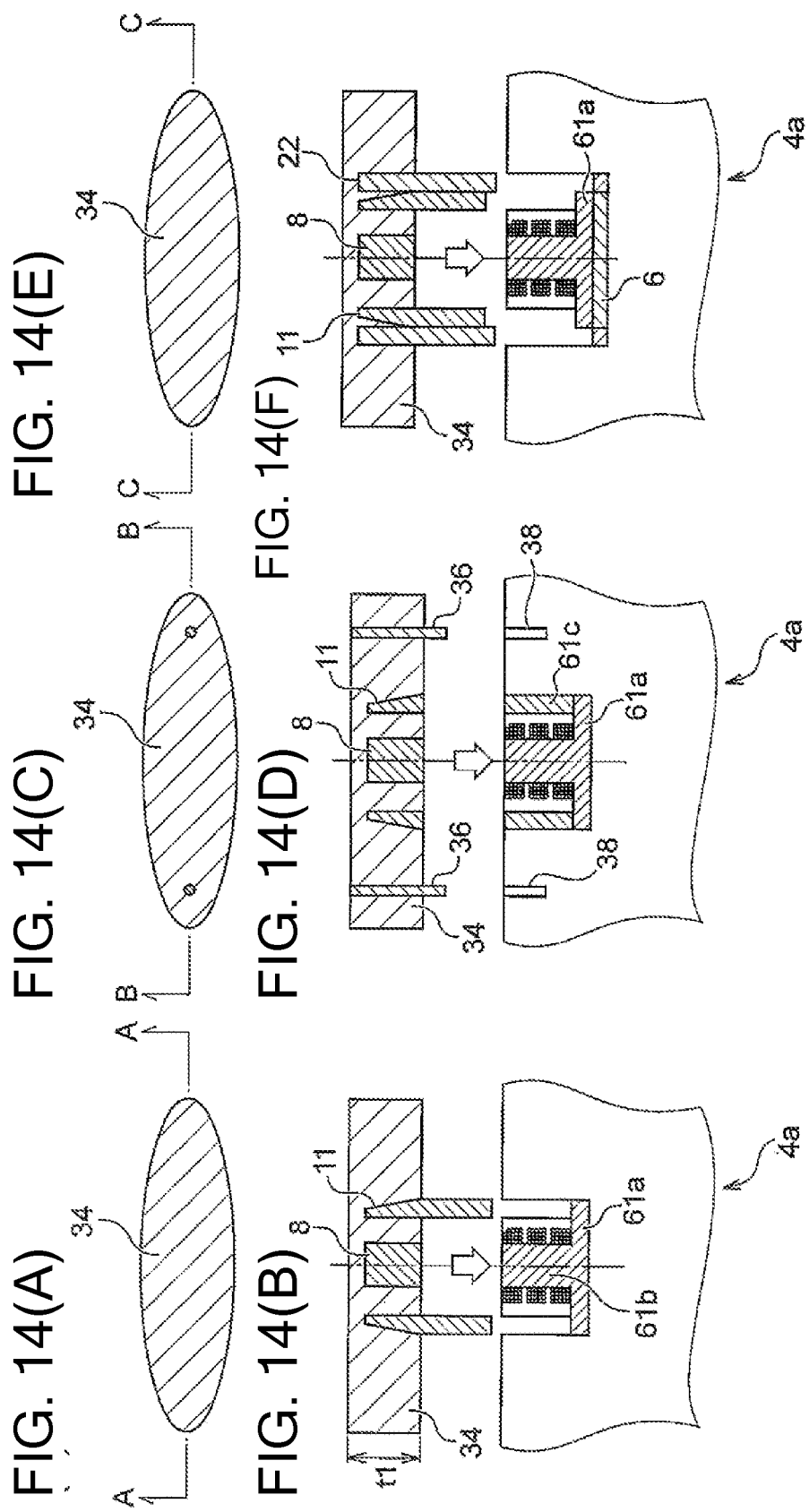

- L1: DETECTION COIL
- L2: EXCITING COIL
- L3: DUMMY COIL

POLISHING APPARATUS

CROSS-REFERENCE TO RELATED APPLICATION

This application claims priority to Japanese Patent Application No. 2016-031970 filed on Feb. 23, 2016. The entire disclosure of Japanese Patent Application No. 2016-031970 filed on Feb. 23, 2016 is incorporated herein by reference in its entirety.

TECHNICAL FIELD

The present relates to a polishing apparatus, and particularly to a polishing apparatus that has an end-point detection sensor for detecting an end point of polishing and is used to polish an electrically conductive film formed on a substrate of a semiconductor wafer or the like.

BACKGROUND ART

Recently, wirings of circuits have become finer as the degree of integration of semiconductor devices has increased, and the distance between the wirings is being narrower. Therefore, it has been necessary to flatten the surfaces of semiconductor wafers as polishing target objects, and polishing using a polishing apparatus has been performed as one of flattening methods.

The polishing apparatus includes a polishing table for holding a polishing pad for polishing a polishing target object, and a top ring for holding the polishing target object and pressing it against the polishing pad. Each of the polishing table and the top ring is rotationally driven by a driving unit (for example, a motor). Liquid (slurry) containing polishing agent is made to flow onto the polishing pad, and the polishing target object held by the top ring is pressed against the polishing pad on which the liquid is made to flow, thereby polishing the polishing target object.

In the polishing apparatus, when the polishing target object is insufficiently polished, the insulation between circuits cannot be secured, and short-circuiting may occur. Furthermore, in the case of over-polishing, the resistance value increases due to reduction of the cross-sectional area of wiring, or the wiring itself is completely removed, resulting in such a problem that the circuit itself is not formed. Therefore, it has been required in the polishing apparatus that the optimum polishing end point is detected.

Such a technique is described in Japanese Patent Laid-Open No. 2012-135865 and Japanese Patent Laid-Open No. 2013-58762. In these techniques described in these publications, an eddy current sensor using a solenoid type or spiral type coil is used as an end-point detection sensor.

In order to reduce the defective rate at a position near to the edge of a semiconductor wafer, it has been recently required that the film thickness is measured over a range containing a position nearer to the edge of the semiconductor wafer and perform film thickness control based on closed loop control of In-situ.

An air bag head type top ring using air pressure or the like is known as one type of top ring. The air bag head has plural concentric air bags. There is a desire to measure the film thickness in a narrower range in order to improve the resolution of irregularities on the surface of a semiconductor wafer by the eddy current sensor and perform the film thickness control with a narrow width air bag.

However, in the case of a solenoid type or spiral type coil, it has been difficult to make the magnetic flux thinner, and it has had a limit to the measurement in a narrow range.

The area of eddy current formed in the polished surface of a semiconductor wafer by a conventional general eddy current sensor (that is, the spot diameter of the eddy current sensor) is equal to about 20 mm or more, a detection monitor region per spot is generally broad, and only a film thickness averaged over a region of a broad range is achieved. Therefore, there is a limit to the detection accuracy of the presence or absence of residual film and the accuracy of profile control, and particularly it has been impossible to cope with the variation in the film thickness at the edge portion of the substrate after polishing. This is because when an electrically conductive film such as a copper film formed on a substrate is polished, the edge portion of the substrate becomes a boundary region, and the film thickness of a film formed in the boundary region is more liable to vary as compared with the film thickness of a film formed at the other places. In addition, it is generally difficult to detect the remaining film having a width of 6 mm or less left on a part of the substrate, and a film to be originally polished remains on the substrate due to the film formation state of the film on the substrate or variation of the polishing condition of the film.

One reason why the spot diameter of the eddy current sensor is broad resides in that the sensor coil diameter is large. In order to solve this problem, it is considered that the sensor coil diameter of the eddy current sensor is reduced, and the detection monitor region of the film thickness is reduced. However, the distance from the eddy current sensor to the film at which the film thickness can be detected by the eddy current sensor has a correlation with the sensor coil diameter, and the distance is reduced as the sensor coil diameter decreases. Since a polishing pad exists between the eddy current sensor and the substrate, it is impossible to set the distance between the eddy current sensor and the substrate to a value equal to or less than the thickness of the polishing pad. When the sensor coil diameter is reduced, the distance from the eddy current sensor to the film at which the film thickness can be detected by the eddy current sensor is reduced. Therefore, it is difficult to form eddy current in the substrate due to the thickness of the polishing pad, and it is also difficult to detect the film thickness.

Another reason why the spot diameter of the eddy current sensor is broad resides in that the distance between the semiconductor wafer and the eddy current sensor is large and thus the magnetic flux expands. In the case of use of the same coil, the magnetic flux expands more greatly and thus the spot diameter of the eddy current sensor increases as the distance between the semiconductor wafer and the eddy current sensor increases. As the magnetic flux expands more greatly, the magnetic flux weakens increasingly, and thus the eddy current formed in the semiconductor wafer weakens increasingly, so that the sensor output decreases. In order to control the film thickness of the semiconductor wafer with high accuracy, an eddy current sensor capable of measuring a narrow range has been desired.

The present invention has been made in view of the foregoing circumstances, and has an object to provide a polishing apparatus that has an end-point detection sensor capable of measuring a narrow range and can enhance the film thickness detection accuracy.

SUMMARY OF INVENTION

According to a first aspect of the present invention, there is provided a polishing apparatus comprising a polishing pad having a polishing surface for polishing a polishing target object, a polishing table to which a back surface of the polishing pad is fitted, the back surface of the polishing pad being on an opposite side to the polishing surface, and an end-point detection sensor that is arranged in the polishing table and configured to detect an end point of the polishing, wherein the end-point detection sensor includes: a pot core as a magnetic material having a bottom portion, a magnetic core portion arranged in a middle of the bottom portion and a peripheral wall portion arranged around the bottom portion and around the magnetic core portion; an exciting coil that is arranged at the magnetic core portion and configured to form eddy current in the polishing target object; and a detection coil that is arranged at the magnetic core portion or the peripheral wall portion and configured to detect the eddy current formed in the polishing target object, and wherein a space for housing parts of the magnetic core portion and the peripheral wall portion is arranged at a portion facing the polishing table on the back surface side of the polishing pad, the magnetic core portion and the peripheral wall portion extend from the bottom portion to the space, and at least tip portions of the magnetic core portion and the peripheral wall portion extending to the space are located in the space.

According to this aspect, the space for housing parts of the magnetic core portion and the peripheral wall portion is arranged at the portion facing the polishing table on the back surface side of the polishing pad, so that the distance between the polishing target object and the sensor can be shortened. Accordingly, a smaller range of film thickness can be measured with high sensitivity as compared with the prior art.

When only the tip portions of the magnetic core portion and the peripheral wall portion (these are formed of a magnetic material of ferrite or the like) are inserted in the space, only the tip portions may be manufactured in a compact size, and miniaturization of the tip portions can be easily performed because no coil exists. As a result, the spot diameter on the wafer can be easily reduced. Furthermore, since the exciting coil is surrounded by the peripheral wall portion, leakage of the magnetic flux is a little.

Any shape is possible as the shape of the space, and for example, any shape such as a cylindrical shape, a prismatic shape, a conical shape, a truncated conical shape or a truncated pyramid-like shape is possible.

When the detection coil is arranged not at the magnetic core portion, but at the peripheral wall portion, it is preferable to arrange the detection coil at a portion of the peripheral wall portion located in the space of the polishing pad. When the detection coil is arranged at the peripheral wall portion, the peripheral wall portion has a larger outer diameter than the magnetic core portion, so that the detection coil becomes large and the size of a detectable area increases. Furthermore, since the detection coil is arranged in the space of the polishing pad, the detection coil is closer to the polishing target object, and the detection accuracy of the film thickness of the polishing target object is enhanced.

According to a second aspect of the polishing apparatus of the invention of this application, there is provided a polishing apparatus in which at least a part of the magnetic core portion located in the space is separable from at least a part of the magnetic core portion located in the polishing table.

According to a third aspect of the polishing apparatus of the invention of this application, there is provided a polishing apparatus in which at least a part of the peripheral wall portion located in the space is separable from a part of the peripheral wall portion located in the polishing table.

According to the second and third aspects, the following problem can be solved. In a case where a polishing pad having a different shape is mounted on the polishing table for the first time, the following problem occurs when the end-point detection sensor is exposed outwards from the inside of the polishing table to the polishing pad without any separable polishing apparatus like this aspect. It is necessary to adjust the shape of the space and the height of the whole end-point detection sensor from the polishing table every time a polishing pad is newly mounted so that the exposed end-point detection sensor does not come into contact with the polishing pad.

In this aspect, since at least parts of the magnetic core portion and/or the peripheral wall portion located in the space are separable from at least parts of the magnetic core portion and/or the peripheral wall portion located in the polishing table, at least parts of the magnetic core portion and/or the peripheral wall portion located in the space may be exchanged. The shape of the polishing pad, particularly the thickness of the polishing pad varies according to the type of the polishing pad, and it is preferable to change the height of the space provided to the polishing pad according to the variation of the thickness. In connection with the change of the height of the space, it is needed to change the shape of the magnetic core portion and/or the peripheral wall portion. At this time, it is unnecessary in this aspect to change the whole shape of the end-point detection sensor, and only the tip portions of the magnetic core portion and/or the peripheral wall portion may be changed. Therefore, the change of the polishing pad can be easily dealt with.

In this aspect, it is unnecessary to adjust the height of the whole end-point detection sensor for the purpose of easily keeping the distance between the tip portion of the end-point detection sensor and the polishing target object to the shortest distance at all times. That is, only the exchange of the tip portion is sufficient. Furthermore, even when the distance is adjusted to a distance other than the shortest distance to adjust the spot diameter, it is unnecessary to adjust the height of the whole end-point detection sensor.

According to a fourth aspect of the polishing apparatus of the invention of this application, there is provided a polishing apparatus in which the space penetrates from the back surface of the polishing pad to the polishing surface.

According to this aspect, when the end-point detection sensor is installed in the rotational table, particularly when at least a part of the separable magnetic core portion and/or at least a part of the peripheral wall portion is positioned and installed, a position adjusting work, etc. can be easily performed because the upper surface of the polishing pad is opened. In the case of this aspect, polishing liquid or the like infiltrates from the upper surface of the polishing pad into the sensor portion. In order to deal with this, a water discharging mechanism may be provided to the sensor portion.

The magnetic core portion and the peripheral wall portion may be configured so that the magnetic core portion is separable while the peripheral wall portion is not separable, and the separable magnetic core portion and the non-separable peripheral wall portion can be integrally installed to and removed from the sensor main body as a whole. In this case, when the sensor is manufactured, specifically when the coil is wound around the magnetic core portion, the magnetic core portion wounded by the coil can be exposed. Therefore, there is an advantage that a work of winding the coil around the magnetic core portion can be easily performed.

According to a fifth aspect of the polishing apparatus of the invention of this application, there is provided a polishing apparatus having a metal shield which is arranged around an outer periphery of the peripheral wall portion, and shields magnetic field generated by the exciting coil. According to this aspect, since the metal shield is arranged at the outside of the peripheral wall portion, leaking magnetic flux is reduced, and thus the spot diameter of a magnetic flux formed on the polishing target object can be reduced.

According to a sixth aspect of the polishing apparatus of the invention of this application, there is provided a polishing apparatus comprising a polishing pad having a polishing surface for polishing a polishing target object, a polishing table to which a back surface of the polishing pad is fitted, the back surface being at an opposite side to the polishing surface, and an end-point detection sensor that is arranged in the polishing table and configured to detect an end point of the polishing, wherein the end-point detection sensor includes: a pot core as a magnetic material having a bottom portion and a peripheral wall portion arranged around the bottom portion; an exciting coil that is arranged in a middle of the bottom portion and configured to form eddy current in the polishing target object; and a detection coil that is an air-core coil or a coil arranged at the peripheral wall portion with the peripheral wall portion serving as a core, and is configured to detect the eddy current formed in the polishing target object, and wherein the peripheral wall portion is arranged around the exciting coil, the exciting coil is an air-core coil having an air core portion, a space for housing a part of the peripheral wall portion is arranged at a portion facing the polishing table on the back surface of the polishing pad, the peripheral wall portion extends from the bottom portion to the space, at least a tip portion of the peripheral wall portion extending to the space is located in the space, the pot core has a magnetic core portion as a magnetic material at an extension position of the air core portion that extends to the space, the magnetic core portion extends from the air core portion to the space, and at least tip portion of the magnetic core portion extending to the space is located in the space.

According to this aspect, the exciting coil is an air-core coil and has no core. No coil is wound around the core. The exciting frequency can be set to a high value because of the air-core coil, so that the spatial resolution can be enhanced. Furthermore, since the exciting coil is surrounded by the peripheral wall portion, leakage of magnetic flux is a little.

According to a seventh aspect of the polishing apparatus of the invention of this application, there is provided a polishing apparatus in which at least a part of the peripheral wall portion located in the space is separable from at least a part of the peripheral wall portion located in the polishing table.

According to an eighth aspect of the polishing apparatus of the invention of this application, there is provided a polishing apparatus in which the detection coil is arranged at the magnetic core portion or the peripheral wall portion that is located in the space. In this case, since the detection coil is arranged in the space of the polishing pad, the detection coil is closer to the polishing target object, and the detection accuracy of the film thickness of the polishing target object is enhanced.

According to a ninth aspect of the polishing apparatus of the invention of this application, there is provided a polishing apparatus in which the magnetic core portion and the peripheral wall portion that are located in the space are held by a holding portion, and the holding portion is fixed to the end-point detection sensor or the polishing table.

BRIEF DESCRIPTION OF DRAWINGS

FIG. 14(A) is a plan view illustrating a fixing method for the magnetic core portion and the peripheral wall portion shown in FIG. 9(A);

FIG. 14(B) is a cross-sectional view illustrating the fixing method for the magnetic core portion and the peripheral wall portion shown in FIG. 9(A);

FIG. 14(C) is plan view illustrating a fixing method for the magnetic core portion and the peripheral wall portion shown in FIG. 6(A);

FIG. 14(D) is a cross-sectional view illustrating the fixing method for the magnetic core portion and the peripheral wall portion shown in FIG. 6(A);

FIG. 14(E) is a plan view illustrating a fixing method for the magnetic core portion and the peripheral wall portion shown in FIG. 10(A);

FIG. 14(F) is a cross-sectional view illustrating the fixing method for the magnetic core portion and the peripheral wall portion shown in FIG. 10(A);

DESCRIPTION OF EMBODIMENTS

Figure 1:
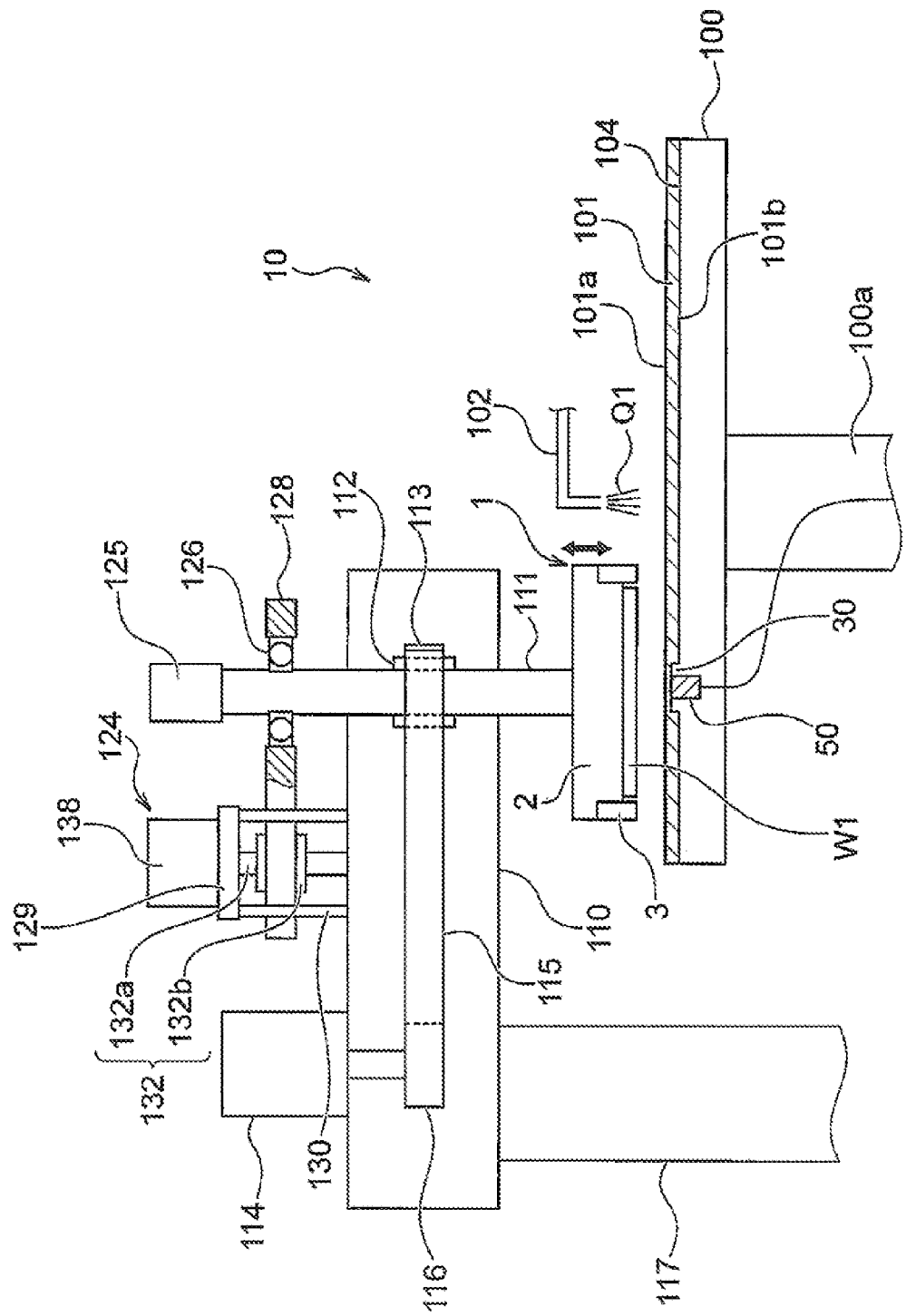
FIG. 1 is a schematic diagram showing the overall configuration of a polishing apparatus according to an embodiment.

An embodiment of a polishing apparatus according to the present invention will be described in detail hereunder with reference to the accompanying drawings. In the accompanying drawings, the same or corresponding constituent elements are represented by the same reference numerals, and duplicative descriptions thereof are omitted.

FIG. 1 is a schematic diagram showing the overall configuration of a polishing apparatus 10 according to an embodiment of the present invention. As shown in FIG. 1, the polishing apparatus 10 includes a polishing table 100, and a top ring 1 which holds a substrate such as a semiconductor wafer W1 as a polishing target object and presses the substrate against a polishing surface on the polishing table 100.

The polishing table 100 is linked to a motor (not shown) as a driving part arranged below the polishing table 100 through a table shaft 100a, and rotatable around the table shaft 100a. A polishing pad 101 is attached to the upper surface (fitting face) 104 of the polishing table 100. The face 101a of the polishing pad 101 constitutes a polishing surface for polishing the semiconductor wafer W1. A back surface 101b of the polishing pad 101 on the opposite side to the polishing surface 101a is fitted to the fitting face 104 of the polishing table 100. The top ring 1 can hold the semiconductor wafer W1 so that the semiconductor wafer W1 faces the polishing surface 101a of the polishing pad 101.

A polishing liquid supply nozzle 102 is arranged above the polishing table 100. Polishing liquid Q1 is supplied onto the polishing pad 101 on the polishing table 100 by the polishing liquid supply nozzle 102. As shown in FIG. 1, an eddy current sensor (end-point detection sensor) 50 for detecting the end point of polishing is embedded in the polishing table 100.

The top ring 1 basically comprises a top ring main body 2 for pressing the semiconductor wafer W1 against the polishing surface 101a, and a retainer ring 3 for holding the outer peripheral edge of the semiconductor wafer W1 so as to prevent the semiconductor wafer W1 from protruding from the top ring 1.

The top ring 1 is connected to a top ring shaft 111. The top ring shaft 111 is configured to be moved in an up-and-down direction relatively to the top ring head 110 by an up-and-down moving mechanism 124. The overall top ring 1 is moved up and down and positioned with respect to the top ring head 110 by the up-and-down movement of the top ring shaft 111. A rotary joint 125 is fitted to the upper end of the top ring shaft 111.

The up-and-down moving mechanism 124 for moving the top ring shaft 111 and the top ring 1 upwards and downwards includes a bridge 128 for supporting the top ring shaft 111 through a bearing 126 so that the top ring shaft 111 is rotatable, a ball screw 132 fitted to the bridge 128, a support table 129 supported by a support pole 130, and an AC servo motor 138 provided on the support table 129. The support table 129 for supporting the servo motor 138 is fixed to the top ring head 110 through the support pole 130.

The ball screw 132 has a screw shaft 132a connected to the servo motor 138, and a nut 132b in which the screw shaft 132a is screwed. The top ring shaft 111 is configured to move up and down integrally with the bridge 128. Accordingly, when the servo motor 138 is driven, the bridge 128 moves up and down through the ball screw 132, whereby the top ring shaft 111 and the top ring 1 move up and down.

The top ring shaft 111 is connected to a rotational cylinder 112 through a key (not shown). The rotational cylinder 112 has a timing pulley 113 on the outer peripheral portion thereof. A top-ring motor 114 is fixed to the top ring head 110, and the timing pulley 113 is connected to a timing pulley 116 provided to the top-ring motor 114 through a timing belt 115. Accordingly, by rotationally driving the top-ring motor 114, the rotational cylinder 112 and the top ring shaft 111 rotate integrally with each other through the timing pulley 116, the timing belt 115 and the timing pulley 113, so that the top ring 1 rotates. The top ring head 110 is supported by the top ring shaft 117 which is rotatably supported by a frame (not shown).

In the polishing apparatus configured as shown in FIG. 1, the top ring 1 is capable of holding a substrate such as the semiconductor substrate W1 on the lower surface thereof. The top ring head 110 is configured to be turnable around the top ring shaft 117, and the top ring 1 which holds a semiconductor wafer W1 on the lower surface thereof is moved from a reception position of the semiconductor wafer W1 to the upper side of the polishing table 100 by turning of the top ring head 110. Then, the top ring 1 is moved down to press the semiconductor wafer W1 against the surface (polishing surface) 101a of the polishing pad 101. At this time, each of the top ring 1 and the polishing table 100 is rotated, and the polishing liquid is supplied from the polishing liquid supply nozzle 102 provided above the polishing table 100 onto the polishing pad 101. As described above, the surface of the semiconductor wafer W1 is polished while the semiconductor wafer W1 is brought into sliding contact with the polishing surface 101a of the polishing pad 101.

Figure 2:
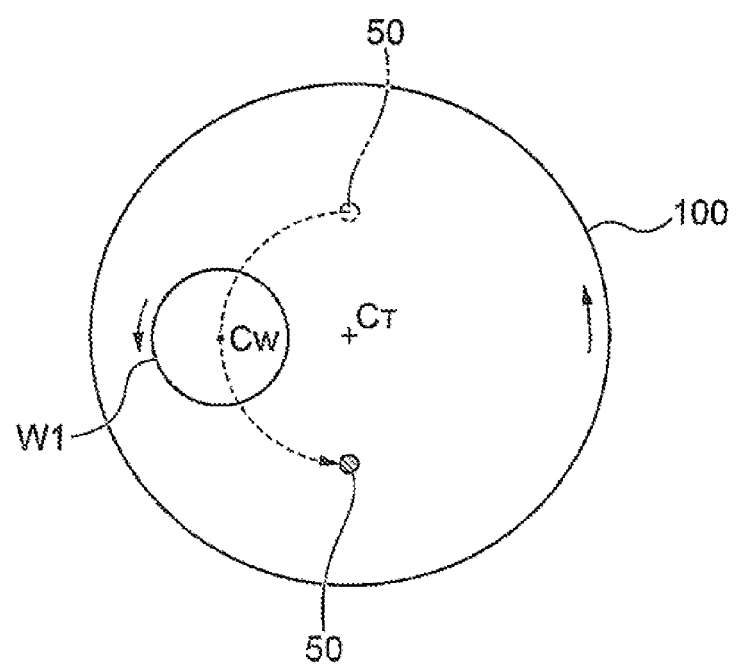
FIG. 2 is a plan view showing the relationship of a polishing table, an eddy current sensor and a semiconductor wafer.

FIG. 2 is a plan view showing the relationship of the polishing table 100, the eddy current sensor 50 and the semiconductor wafer W1. As shown in FIG. 2, the eddy current sensor 50 is arranged so as to pass over the center Cw of the semiconductor wafer W1 which is held on the top ring 1 and is being polished. Reference character $C_T$ represents the rotational center of the polishing table 100. For example, the eddy current sensor 50 can continuously detect a metal film (electrically conductive film) such as a Cu layer of the semiconductor wafer W1 on a passing track (scan line) while the eddy current sensor 50 passes over the lower side of the semiconductor wafer W1.

Next, the eddy current sensor 50 equipped to the polishing apparatus according to an embodiment of the present invention will be described in detail with reference to the accompanying drawings.

Figure 3A:
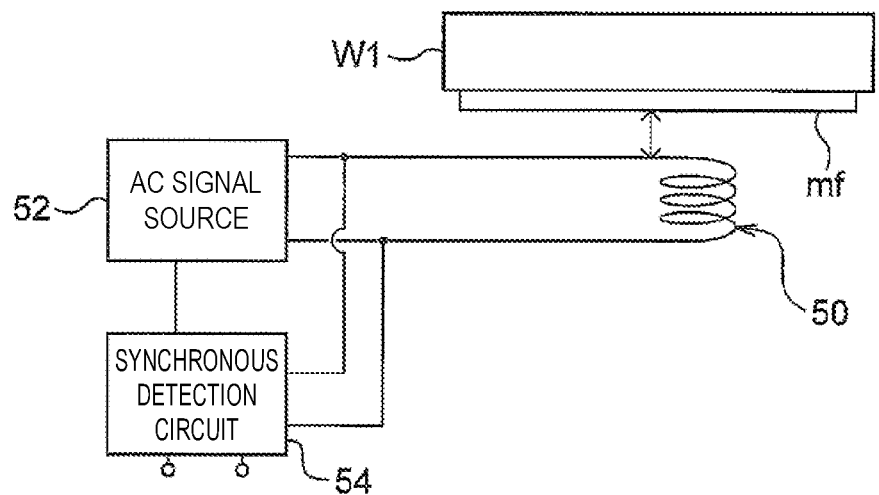
FIG. 3(A) is a block diagram showing the configuration of the eddy current sensor.
Figure 3B:
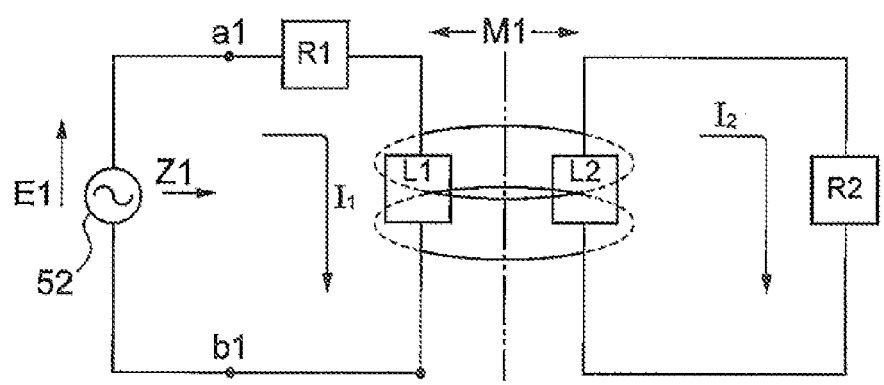
FIG. 3(B) is an equivalent circuit diagram to the block diagram of FIG. 3(A) showing the eddy current sensor.

FIG. 3 is a diagram showing the configuration of the eddy current sensor 50, wherein FIG. 3(A) is a block diagram showing the configuration of the eddy current sensor 50, and FIG. 3(B) is an equivalent circuit diagram of the eddy current sensor 50.

As shown in FIG. 3(A), the eddy current sensor 50 is arranged in the neighborhood of the metal film (or electrically conductive film) mf as a detection target. The specific arrangement of the eddy current sensor 50 will be described later. An AC signal source 52 is connected to the coil of the eddy current sensor 50. Here, the metal film (or electrically conductive film) mf as the detection target is, for example, a thin film formed of Cu, Al, Au or W formed on the semiconductor wafer W1. The eddy current sensor 50 is arranged to be proximate to the metal film (or electrically conductive film) as the detection target at a distance of about 1.0 to 4.0 mm, for example.

As the type of the eddy current sensor are known a frequency type in which occurrence of eddy current in the metal film (or electrically conductive film) mf causes oscillation frequency variation, and variation of the film thickness of the metal film (or electrically conductive film) is detected based on this frequency variation, and an impedance type in which impedance varies and variation of the film thickness of the metal film (or electrically conductive film) is detected based on this impedance variation. In the case of the frequency type, in the equivalent circuit shown in FIG. 3(B), upon variation of eddy current $I_2$, the impedance Z1 varies, and the oscillation frequency of a signal source (variable frequency oscillator) 52 varies. This variation of the oscillation frequency is detected by a detection circuit 54, whereby variation of the metal film (or electrically conductive film) can be detected. In the case of the impedance type, in the equivalent circuit shown in FIG. 3(B), upon variation of the eddy current $I_2$, the impedance Z1 varies, and the impedance Z1 when viewed from the signal source (fixed frequency oscillator) 52 varies. This variation of the impedance Z1 is detected by the detection circuit 54, whereby variation of the metal film (or electrically conductive film) can be detected.

In the impedance type eddy current sensor, a resistance component (R1), a reactance component (X1), an amplitude output $((R1^2+X1^2)^{1/2})$ and a phase output ($\tan^{-1}$ R1/X1) which are associated with variation of the film thickness can be extracted. Measurement information relating to the variation of the film thickness of the metal film (or electrically conductive film) of Cu, Al, Au, W is obtained from the frequency or the amplitude output $((R1^2+X1^2)^{1/2})$ or the like. The eddy current sensor 50 may be incorporated in the polishing table 100 so as to be in proximity to the surface as shown in FIG. 1, and arranged so as to face the semiconductor wafer as a polishing target through the polishing pad, and can detect the variation of the metal film (or electrically conductive film) from the eddy current flowing in the metal film (or electrically conductive film) on the semiconductor wafer.

A single radio wave, mixed radio waves, an AM modulated radio wave, an FM modulated radio wave, a sweep output of a function generator or plural oscillation frequency sources may be used for the frequency of the eddy current sensor. It is preferable that a high-sensitivity oscillation frequency or modulation mode is selected to be conformable with the film type of the metal film.

A specific example of the impedance type eddy current sensor will be described hereunder. The AC signal source 52 is an oscillator of a fixed frequency ranging from about 2 to 30 MHz, and for example a quartz oscillator is used. An AC voltage supplied from the AC signal source 52 causes current $I_1$ to flow in the eddy current sensor 50. When current flows in the eddy current sensor 50 arranged in the neighborhood of the metal film (or electrically conductive film) mf, a magnetic flux interlinks across the metal film (or electrically conductive film) mf to form mutual inductance M1 therebetween, so that eddy current $I_2$ flows in the metal film (or electrically conductive film) mf. Here, R1 represents equivalent resistance at the primary side containing the eddy current sensor, and $L_1$ likewise represents self-inductance at the primary side containing the eddy current sensor. On the metal film (or electrically conductive film) mf side, R2 represents equivalent resistance corresponding to an eddy current loss, and $L_2$ represents the self-inductance thereof. The impedance Z1 when viewing the eddy current sensor side from the terminals a1, b1 of the AC signal source 52 varies according to the magnitude of the eddy current loss of the eddy current formed in the metal film (or electrically conductive film) mf.

Figure 4:
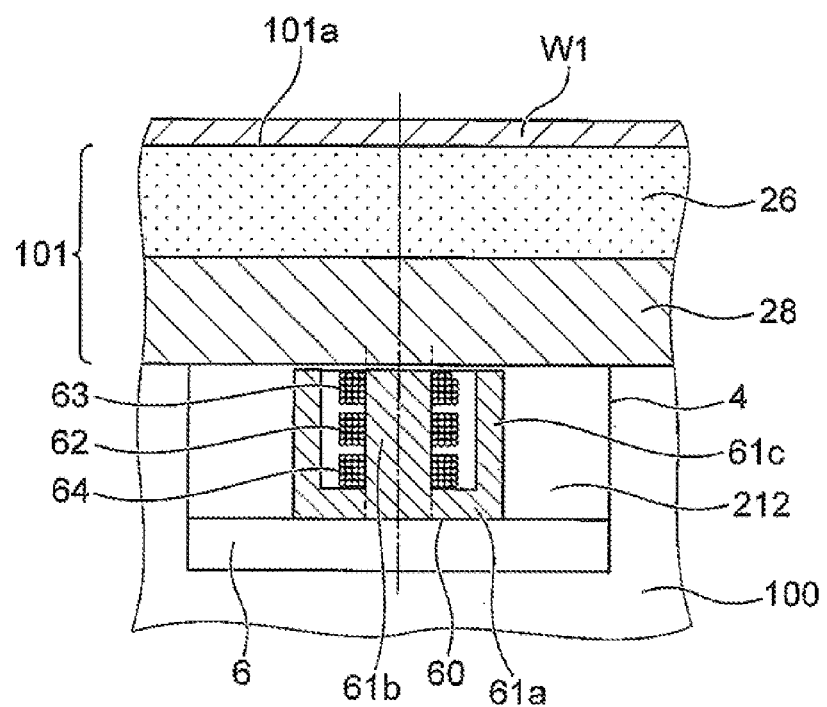
FIG. 4 is an enlarged diagram showing the neighborhood of an eddy current sensor 4 as a comparative example.

First, a polishing apparatus in which a polishing pad having no space for housing parts of the magnetic core portion and peripheral wall portion of the eddy current sensor 4 exists between the eddy current sensor 4 and the substrate is shown as a comparative example of the eddy current sensor 50 of the present application in FIG. 4. In the case shown in FIG. 4, the distance between the eddy current sensor 4 and the substrate cannot be set to the thickness of the polishing pad or less because no space is provided. FIG. 4 is an enlarged cross-sectional view of the neighborhood of the eddy current sensor.

The eddy current sensor 4 comprises a pot core 60 and three coils 62, 63 and 64. The pot core 60 as a magnetic material has a bottom portion 61a, a magnetic core base portion 61b provided in the middle of the bottom portion 61a and a peripheral wall base portion 61c provided around the bottom portion 61a. The bottom portion 61a is fitted to the base portion 6 of the eddy current sensor 4 by an adhesive material, a bolt or the like.

The coil 62 in the middle out of the three coils 62, 63 and 64 is an exciting coil connected to the AC signal source 52. The exciting coil 62 forms eddy current in the metal film (or electrically conductive film) mf on the semiconductor wafer W1 disposed in the neighborhood of the exciting coil 62 with magnetic field which is formed by a voltage supplied from the AC signal source 52. A detection coil 63 is arranged on the metal film (or electrically conductive film) side of the exciting coil 62 to detect magnetic field generated by the eddy current formed in the metal film (or electrically conductive film). A dummy coil 64 is arranged on the opposite side to the detection coil 63 with respect to the exciting coil 62. The exciting coil 62 is arranged at the magnetic core base portion 61b to form eddy current in the electrically conductive film. The detection coil 63 is arranged at the magnetic core base portion 61b to detect eddy current formed in the electrically conductive film.

The frequency to be applied to the exciting coil 62 may be any frequency, and for example an electrical signal of 2 to 30 MHz is applicable. The material of the magnetic core of the eddy current sensor may be Mn—Zn ferrite which is high in both magnetic permeability and dielectric constant, or Ni—Zn ferrite which is low in both magnetic permeability and dielectric constant.

The eddy current sensor has the dummy coil 64 arranged at the magnetic core base portion 61*b*, and the dummy coil 64 detects the eddy current formed in the electrically conductive film. The axial direction of the magnetic core base portion 61*b* is perpendicular to the electrically conductive film on the substrate, and the detection coil 63, the exciting coil 62 and the dummy coil 64 are arranged at different positions in the axial direction of the magnetic core base portion 61*b*. The detection coil 63, the exciting coil 62 and the dummy coil 64 are also arranged in this order from a nearer position to the electrically conductive film on the substrate toward a farther position in the axial direction of the magnetic core base portion 61*b*. Lead wires for connection to the external are drawn out from the detection coil 63, the exciting coil 62 and the dummy coil 64.

The polishing pad 101 includes a polishing layer 26 having a polishing surface 101*a*, and a backing layer 28 having a back surface 101*b*. The polishing layer 26 is formed of foamed polyurethane sheet or the like. The backing layer 28 is formed of polyurethane, non-woven cloth or the like. The polishing layer 26 has a foamed structure or a non-foamed structure. In the case of the non-foamed structure, the polishing surface 101*a* is roughened by conducting a dressing treatment on polyurethane or the like, thereby enhancing the holding force for polishing agent.

Figure 5A:
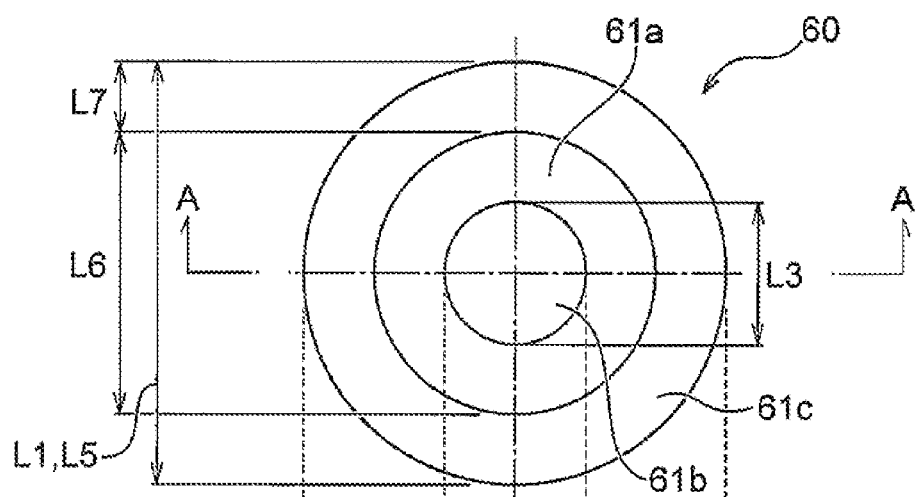
FIG. 5(A) is a plan view of a diagram showing the detailed shape of a pot core 60.
Figure 5B:
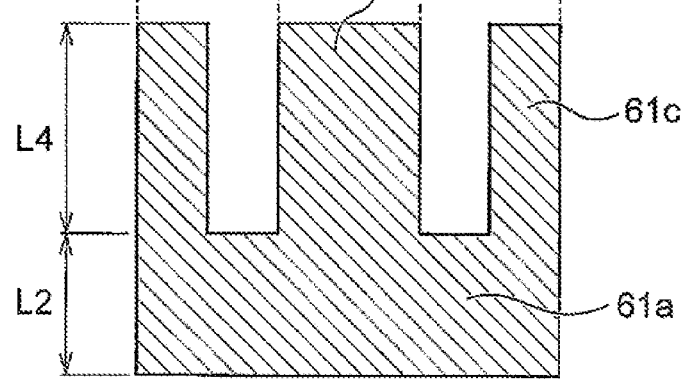
FIG. 5(B) is a cross sectional view taken along arrows A-A of FIG. 5(A)

FIG. 5 shows the detailed shape of the pot core 60, wherein FIG. 5(A) is a plan view and FIG. 5(B) is a cross-sectional view taken along arrows A-A of FIG. 5(A). The pot core 60 as a magnetic material has a disc-shaped bottom portion 61*a*, a columnar magnetic core base portion 61*b* provided in the middle of the bottom portion 61*a* and a cylindrical peripheral wall base portion 61*c* provided on the periphery of the bottom portion 61*a*. An example of the dimension of the pot core 60 is as follows: the diameter L1 of the bottom portion 61*a* is set to 9 mm, the thickness L2 is set to 3 mm, the diameter L3 of the magnetic core base portion 61*b* is set to 3 mm, the height L4 is set to 5 mm, the outer diameter L5 of the peripheral wall base portion 61*c* is set to 9 mm, the inner diameter L6 is set to 5 mm, the thickness L7 is set to 2 mm, and the height L4 is set to 5 mm. The height L4 of the magnetic core base portion 61*b* and the height L4 of the peripheral wall base portion 61*c* are the same in FIG. 5, but the height L4 of the magnetic core base portion 61*b* may be higher or lower than the height L4 of the peripheral wall base portion 61*c*. In FIG. 5, the outer shape of the peripheral wall base portion 61*c* is a cylindrical shape having the same outer diameter in the height direction, but it may be a tapered shape which is narrower in a direction farther away from the bottom portion 61*a*, that is, to the distal end thereof.

In order to prevent magnetic field from leaking to the surrounding of the pot core 60, it is preferable that the thickness L7 of the peripheral wall base portion 61*c* is equal to a half or more of the diameter L3 of the magnetic core base portion 61*b*, and also the thickness L2 of the bottom portion 61*a* is equal to or more than the diameter L3 of the magnetic core base portion 61*b*.

Conducting wires used for the detection coil 63, the exciting coil 62 and the dummy coil 64 are formed of copper wires, manganin wires or nichrome wires. By using the manganin wires or nichrome wires, the temperature-dependent variation of electrical resistance, etc. can be reduced, and the temperature characteristic is enhanced.

Figure 6:
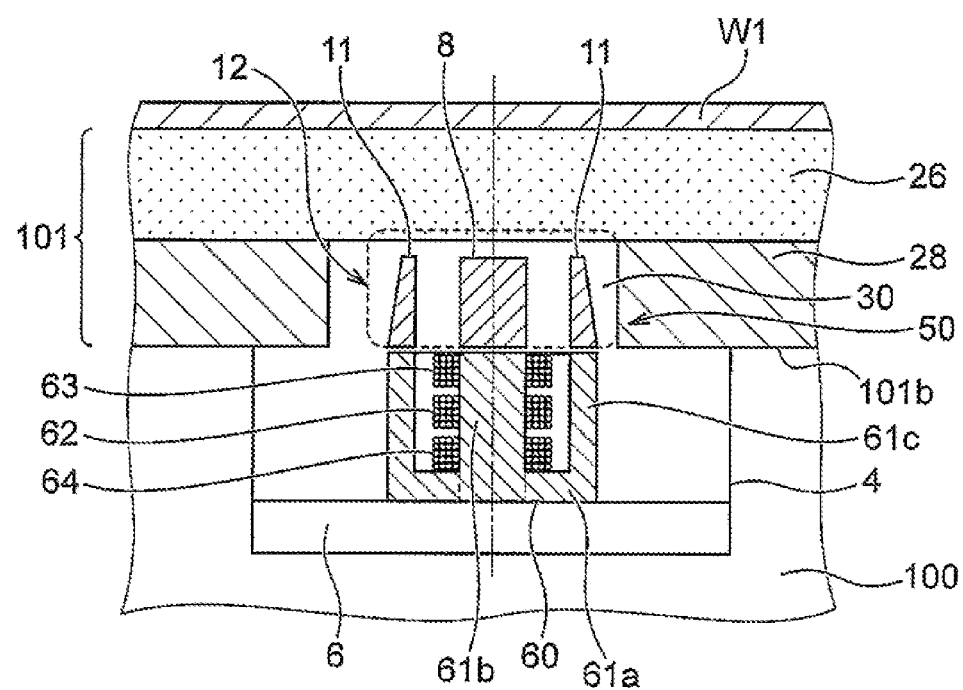
FIG. 6 is a schematic diagram showing an example of the configuration of an eddy current sensor 50 according to the present invention.

Next, the eddy current sensor 50 of the present invention will be described with reference to FIG. 6. FIG. 6 is a schematic diagram showing an example of the configuration of the eddy current sensor 50 of the present invention. A space 30 for housing parts of the magnetic core portion and peripheral wall portion (a magnetic core extension portion 8 and a peripheral wall extension portion 11) of the eddy current sensor 50 is arranged at a portion facing the polishing table 100 on the back surface 101*b* of the polishing pad 101. The magnetic core portion and the peripheral wall portion extend from the bottom portion 61*a* to the space 30, and at least tip portions of the magnetic core portion and the peripheral wall portion (the magnetic core extension portion 8 and the peripheral wall extension portion 11) extending to the space 30 are located in the space 30.

According to this embodiment, since the back surface 101*b* of the polishing pad 101 has the space 30 for housing the parts of the magnetic core portion and the peripheral wall portion (the magnetic core extension portion 8 and the peripheral wall extension portion 11) at the portion facing the polishing table 100, the distance between the polishing target object and the sensor can be shortened. Accordingly, the film thickness in a smaller range can be measured with high sensitivity as compared with the prior art.

In this embodiment, the part of the magnetic core portion (the magnetic core extension portion 8) located in the space 30 is separated from the part of the magnetic core portion (the magnetic core base portion 61*b*) located in the polishing table 100. Furthermore, the part of the peripheral wall portion (the peripheral wall extension portion 11) located in the space 30 is separated from the part of the peripheral wall portion (the peripheral wall base portion 61*c*) located in the polishing table 100. That is, the magnetic core portion comprises the magnetic core base portion 61*b* and the magnetic core extension portion 8, and the peripheral wall portion comprises the peripheral wall base portion 61*c* and the peripheral wall extension portion 11. The eddy current sensor 50 of this embodiment is configured by adding the eddy current sensor 4 of the comparative example with the magnetic core extension portion 8 and the peripheral wall extension portion 11 which comprise only magnetic bodies. In the following description, the portion comprising the magnetic core extension portion 8 and the peripheral wall extension portion 11 will be referred to as "magnetic material core portion 12". A method of fixing the magnetic core extension portion 8 and the peripheral wall extension portion 11 will be described later.

In this embodiment, the part of the magnetic core portion located in the space 30 is separable from the part of the magnetic core portion located in the polishing table. Furthermore, the part of the peripheral wall portion located in the space 30 is separable from the part of the peripheral wall portion located in the polishing table. Therefore, the height of the space 30 provided to the polishing pad 101 varies in accordance with the shape of the polishing pad 101, particularly the thickness of the polishing pad 101, and this variation can be easily dealt with by exchanging only the part of the magnetic core portion located in the space 30 and the part of the peripheral wall portion located in the space 30.

The detection coil 63, the exciting coil 62 and the dummy coil 64 shown in FIG. 6 are normal solenoid coils. However, those coils of the present invention are not limited to the solenoid coils. The detection coil 63, the exciting coil 62 and the dummy coil 64 may be spiral coils. The difference between the solenoid coil and the spiral coil is as follows. The solenoid coil is a coil having a three-dimensional shape, and the shape thereof is a helical shape, particularly a spiral shape which is densely wound in the axial direction of the coil (plural "layers" defined in the later description may be stacked). Furthermore, the spiral coil is a coil having a two-dimensional shape, and it is a coil which is wound in an eddy-like shape (spirally) on the plane.

Figure 7:
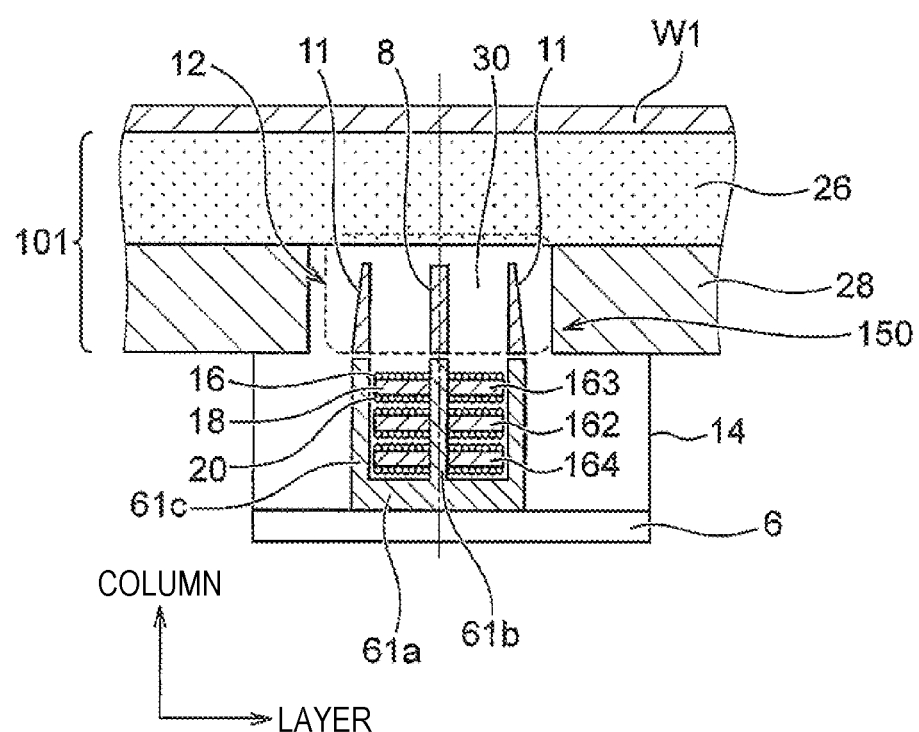
FIG. 7 is a schematic diagram showing an example of the configuration of an eddy current sensor 150 using a spiral coil.

FIG. 7 shows an example of an eddy current sensor 150 using a spiral coil. FIG. 7 is a schematic diagram showing an example of the configuration of the eddy current sensor 150 using the spiral coil. The eddy current sensor 150 of FIG. 7 is the same as the eddy current sensor 50 of FIG. 6 except that the detection coil 163, the exciting coil 162 and the dummy coil 164 are spiral coils. In the eddy current sensor 150, the main body portion 14 corresponding to the eddy current sensor 4 of the comparative example shown in FIG. 4 is a spiral coil.

When "column" is defined in the direction vertical to the semiconductor wafer (substrate) W and "layer" is defined in the direction parallel to the semiconductor wafer (substrate) W, each of three coils 162, 163 and 164 of the eddy current sensor 150 of FIG. 7 is obtained by spirally winding a wire rod in the winding form of 1 column and N layers. In more detail, when the column is defined in the direction vertical to the surface of the semiconductor wafer (substrate) W on which the metal film (or electrically conductive film) is formed, and the layer is defined in the direction parallel to the surface of the semiconductor wafer (substrate) W on which the metal film (or electrically conductive film) is formed, each of the three coils 162, 163 and 164 is a coil obtained by spirally winding a wire rod in the winding form of 1 column and N layers. N represents an integer of 2 or more, and for example, N is equal to 10 or more when the number of windings is equal to that of the prior art or more. In the example shown in FIG. 7, the coil is a 1-column and 8-layers coil. However, each of the coils 162, 163 and 164 comprises two spiral coils. For example, the detection coil 163 comprises two spiral coils 16 and 20. The two spiral coils 16, 20 are arranged on the upper and lower surfaces of the disc-shaped magnetic material 18.

According to the eddy current sensor 150 using the spiral coil, the detection coil 163 comprises a spiral coil configured by winding a wire rod or conductor in the winding form of 1 column and plural layers. Therefore, the detection coil 163 can be made to be closer to the substrate as compared with a case where the detection coil 163 comprises a solenoid coil. Furthermore, in the case of the spiral coil, the capacity component between wires can be reduced, and thus sensor sensitivity is enhanced. Accordingly, the metal thin film (or electrically conductive thin film) on the substrate such as the semiconductor wafer can be detected without increasing the oscillation frequency of the eddy current sensor 150, the amplification degree of the internal circuit and the exciting voltage.

Figure 8A:
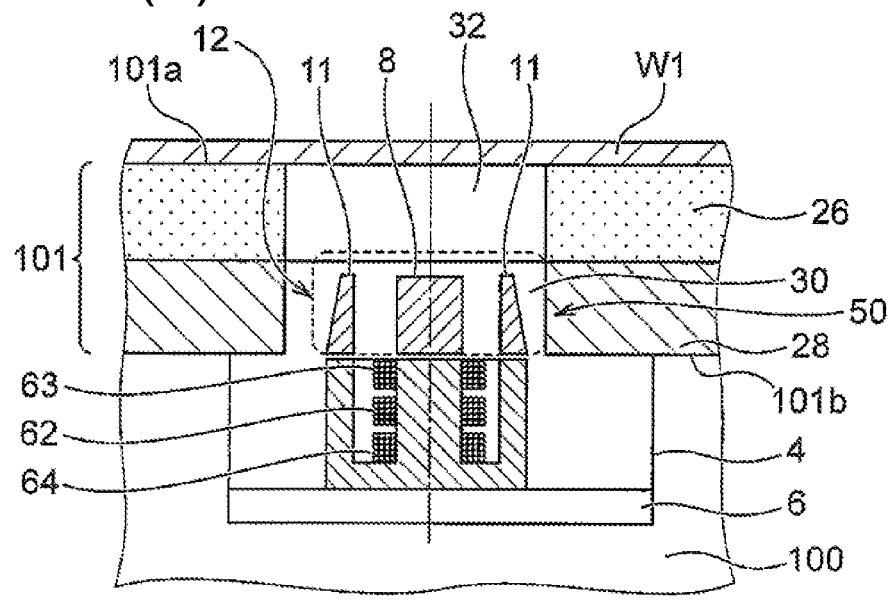
FIG. 8(A) is a schematic diagram showing an example of the configuration of an eddy current sensor 50 using a solenoid coil.
Figure 8B:
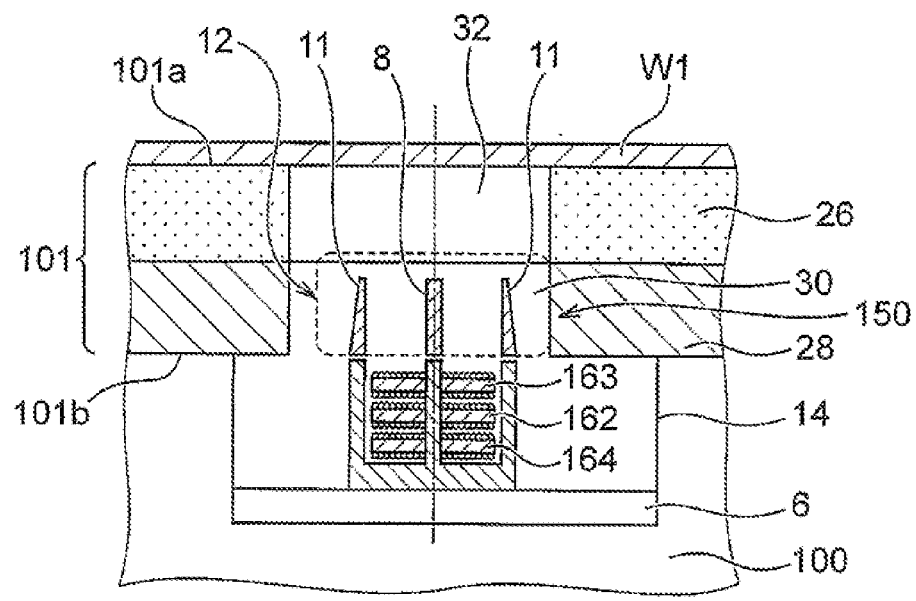
FIG. 8(B) is a schematic diagram showing an example of the configuration of the eddy current sensor 150 using the spiral coil.

Next, an embodiment in which a space for housing parts of the magnetic core portion and the peripheral wall portion penetrates from the back surface 101b of the polishing pad 101 to the polishing surface 101a will be described with reference to FIG. 8. FIG. 8(A) is a schematic diagram showing an example of the configuration of an eddy current sensor 50 using a solenoid coil. FIG. 8(B) is a schematic diagram showing an example of the configuration of an eddy current sensor 150 using a spiral coil. In FIGS. 8(A) and 8(B), the space 32 for housing parts of the magnetic core portion and the peripheral wall portion, specifically the space 32 for housing the magnetic material core portion 12 penetrates from the back surface 101b of the polishing pad 101 to the polishing surface 101a. According to this embodiment, when the eddy current sensors 50, 150 are installed in the polishing table 100, specifically when the magnetic material core portion 12 is positioned and installed, the upper surface 101a of the polishing pad 101 is opened, so that a position adjusting work, etc. can be easily performed.

Figure 9A:
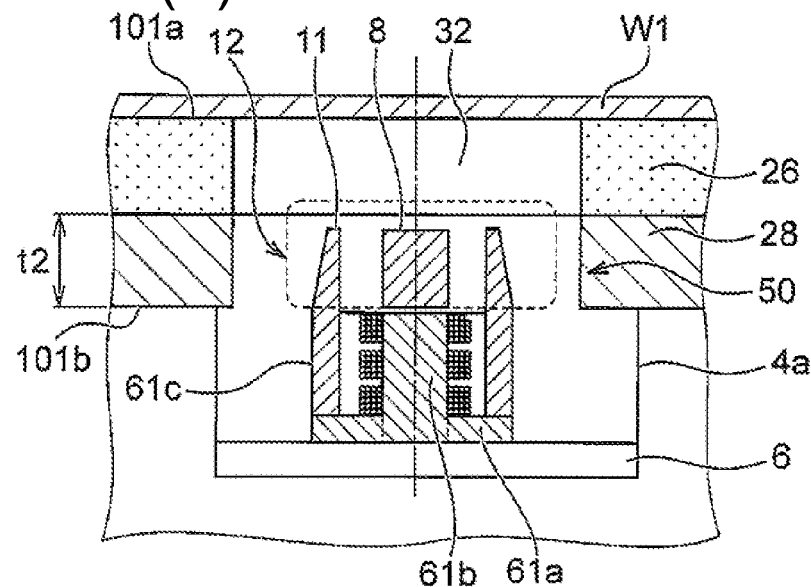
FIG. 9(A) is a schematic diagram showing an example of the configuration of the eddy current sensor 50 using the solenoid coil.
Figure 9B:
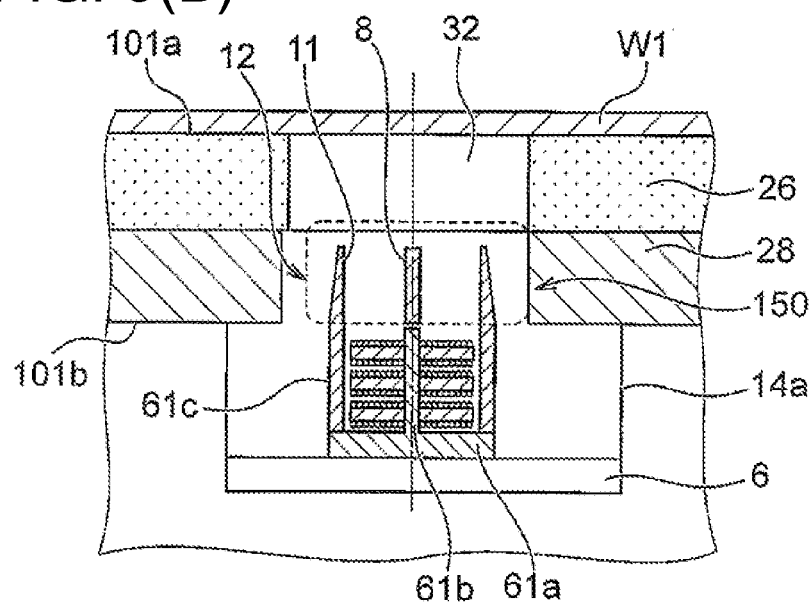
FIG. 9(B) is a schematic diagram showing an example of the configuration of the eddy current sensor 150 using the spiral coil.

Next, an embodiment in which the magnetic core portion is separable, the peripheral wall portion is not separable (non-separable), and the separable magnetic core portion and the entire non-separable peripheral wall portion can be integrally installed in and removed from the sensor main body will be described with reference to FIG. 9. FIG. 9(A) is a schematic diagram showing an example of the configuration of the eddy current sensor 50 using the solenoid coil. FIG. 9(B) is a schematic diagram showing an example of the configuration of the eddy current sensor 150 using the spiral coil. In FIGS. 9(A) and 9(B), the magnetic core portion is separable into the magnetic core base portion 61b and the magnetic core extension portion 8. The peripheral wall portion is not separable, and the peripheral wall base portion 61c and the peripheral wall extension portion 11 are integrated with each other into one part.

The eddy current sensors 50, 150 shown in FIG. 9 are different from the eddy current sensors 50, 150 shown in FIG. 8 in that they have the non-separable peripheral wall portion. In this embodiment, the separable magnetic core portion (the magnetic core extension portion 8) and the overall non-separable peripheral wall portion (the peripheral wall base portion 61c and the peripheral wall extension portion 11) are integrally attachable to and detachable from the sensor main body portions 4a, 14a, specifically the bottom portion 61a (see FIGS. 14(A), 14(B) described later). In this case, when the sensor is manufactured, specifically when the coils are wound around the magnetic core base portion 61b, the magnetic core base portion 61b around which the coils are wound is allowed to be exposed, and thus there is an advantage that a work of winding the coils around the magnetic core base portion 61b can be easily performed.

Figure 10A:
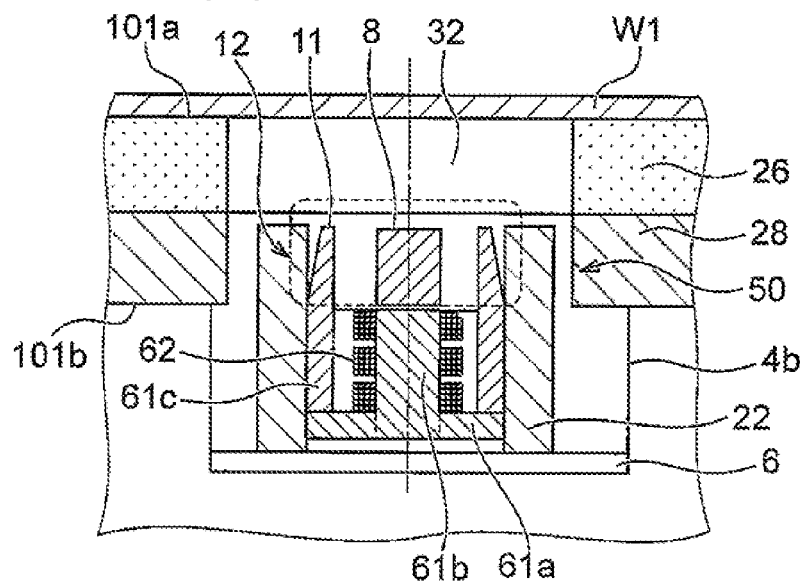
FIG. 10(A) is a schematic diagram showing an example of the configuration of the eddy current sensor 50 using the solenoid coil.
Figure 10B:
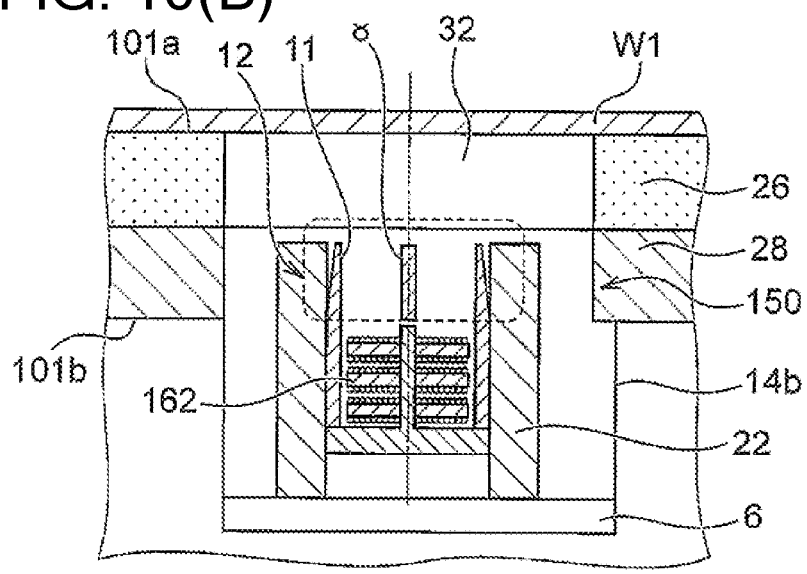
FIG. 10(B) is a schematic diagram showing an example of the configuration of the eddy current sensor 150 using the spiral coil.

Next, an embodiment having a metal shield which is arranged around the outer periphery of the peripheral wall portion and shields magnetic field generated by the exciting coil will be described with reference to FIG. 10. FIG. 10(A) is a schematic diagram showing an example of the configuration of the eddy current sensor 50 using the solenoid coil. FIG. 10(B) is a schematic diagram showing an example of the configuration of the eddy current sensor 150 using the spiral coil. In FIGS. 10(A) and 10(B), the metal shield 22 is arranged around the outer periphery of the non-separable peripheral wall portion (the peripheral base portion 61c and the peripheral wall extension portion 11). The metal shield 22 shields magnetic field generated by the exciting coils 62, 162. The metal shield 22 is applicable to the eddy current sensor having the separable peripheral wall portion shown in FIGS. 6 and 7.

The eddy current sensors 50, 150 shown in FIG. 10 are different from the eddy current sensors 50, 150 shown in FIG. 9 in that the main body portions 4b, 14b have the metal shield 22. According to this embodiment, the metal shield 22 is provided at the outside of the peripheral wall base portion 61c and the peripheral wall extension portion 11, so that the leaking magnetic flux is reduced, and the spot diameter of the magnetic flux formed on the wafer W1 is smaller as compared with an eddy current sensor having no metal shield 22.

Figure 11A:
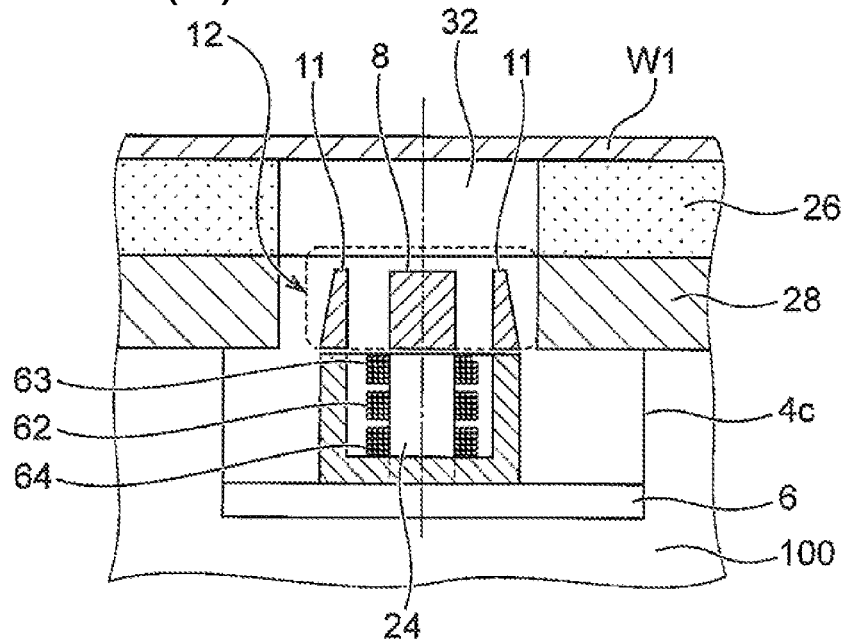
FIG. 11(A) is a schematic diagram showing an example of the configuration of the eddy current sensor 50 using the solenoid coil.
Figure 11B:
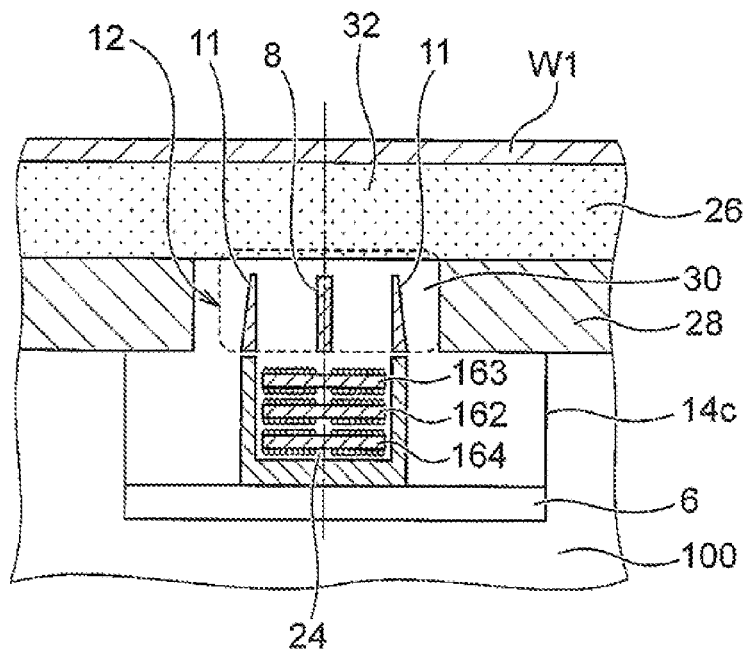
FIG. 11(B) is a schematic diagram showing an example of the configuration of the eddy current sensor 150 using the spiral coil.

Next, an embodiment in which the exciting coil, the detection coil and the dummy coil are air-core coils having air-core portions will be described with reference to FIG. 11. FIG. 11(A) is a schematic diagram showing an example of the configuration of the eddy current sensor 50 using the solenoid coil. FIG. 11(B) is a schematic diagram showing an example of the configuration of the eddy current sensor 150 using the spiral coil. In FIGS. 11(A) and 11(B), the exciting coils 62, 162, the detection coils 63, 163 and the dummy coils 64, 164 are air-core coils having air-core portions.

The eddy current sensors 50, 150 shown in FIG. 11 are different from the eddy current sensors 50, 150 shown in FIG. 8 in that the coils of the main body portions 4c, 14c are air-core coils. According to this embodiment, the exciting coils 62, 162 have air-cores, the magnetic core base portion (core) 61b shown in FIG. 8 does not exist, and no coil is wound around the magnetic core base portion 61b. The air-core coil makes it possible to set the exciting frequency to a high value and enhance the spatial resolution. Furthermore, since the periphery of the exciting coil is surrounded by the peripheral wall portion (that is, yoke) 61c, and the leakage of the magnetic flux is a little.

Figure 12A:
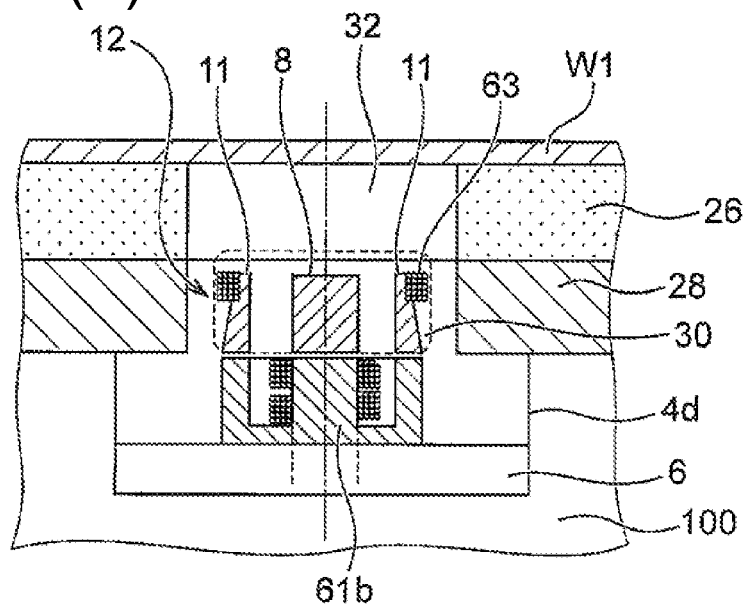
FIG. 12(A) is a schematic diagram showing an example of the configuration of the eddy current sensor 50 using the solenoid coil.
Figure 12B:
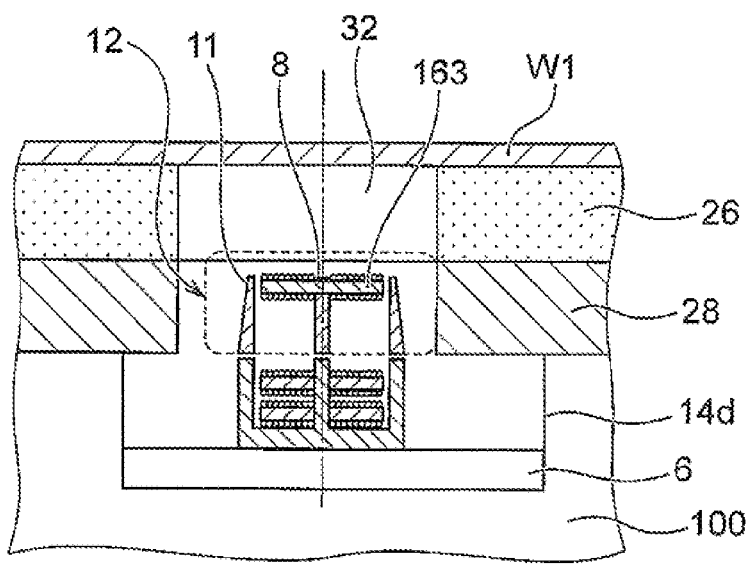
FIG. 12(B) is a schematic diagram showing an example of the configuration of the eddy current sensor 150 using the spiral coil.

Next, an embodiment having a detection coil which is arranged at the magnetic core portion or the peripheral wall portion located in the spaces 30, 32 and detects eddy current formed in the polishing target object will be described with reference to FIG. 12. FIG. 12(A) is a schematic diagram showing an example of the configuration of the eddy current sensor 50 using the solenoid coil. FIG. 12(B) is a schematic diagram showing an example of the configuration of the eddy current sensor 150 using the spiral coil.

In FIG. 12(A), a detection coil 63 is arranged at the peripheral wall portion (peripheral wall extension portion) 10 in the space 30, and detects eddy current formed in the wafer W1. In FIG. 12(B), a detection coil 163 is arranged at the magnetic core portion (magnetic core extension portion) 8 in the space 32, and detects eddy current formed in the wafer W1.

The eddy current sensors 50, 150 shown in FIG. 12 are different from the eddy current sensors 50, 150 shown in FIG. 8 in that the detection coils 63, 163 are located in the spaces 30, 32. In FIG. 12(A), in order to insert the detection coil 63 in the space 30 of the polishing pad 101, the detection coil 63 is separated from the magnetic core base portion 61b and arranged at the peripheral wall extension portion 11. Since the peripheral wall extension portion 11 has a larger outer diameter than the magnetic core base portion 61b, the detection coil 63 is larger in size and the size of a detectable area is larger. In FIGS. 12(A) and 12(B), since the detection coils 63, 163 are arranged in the spaces 30, 32 of the polishing pad 101, the detection coils 63, 163 are closer to the polishing target object, and the detection accuracy of the film thickness of the polishing target object is enhanced. In FIGS. 12(A) and 12(B), since the detection coils 63, 163 are arranged in the spaces 30, 32, there is an advantage that the main body portions 4d, 14d in the polishing table 100 are miniaturized in the axial direction of the coils as compared with the main body portions 4, 14 of FIG. 8.

Figure 13:
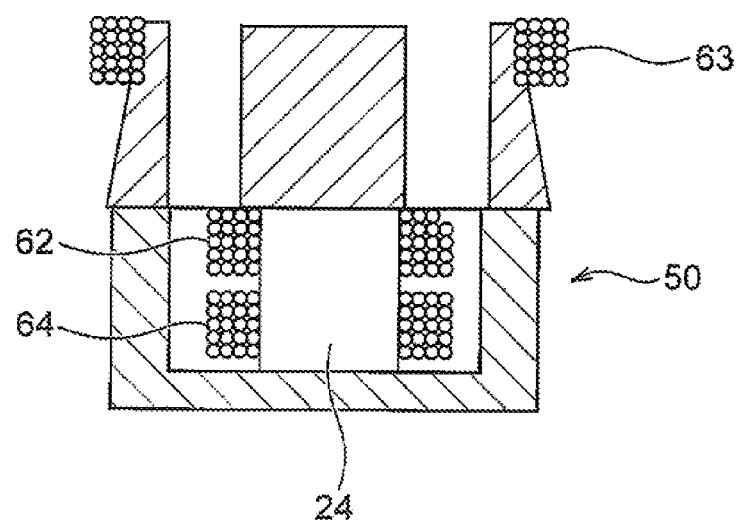
FIG. 13 is a schematic diagram showing an example of the configuration of the eddy current sensor 50 using the solenoid coil.

Next, an embodiment of the combination of FIGS. 11(A) and 12(A) will be described with reference to FIG. 13. That is, in this embodiment, the exciting coil and the dummy coil are air-core coils having air-core portions, and the detection coil is arranged at the peripheral wall portion in the space 30. FIG. 13 is a schematic diagram showing an example of the configuration of the eddy current sensor 50 using the solenoid coil. In FIG. 13, the exciting coil 62 and the dummy coil 64 are air-core coils having air-core portions 24. The detection coil 63 is arranged at the peripheral wall portion (peripheral wall extension portion) 10 in the space 30.

Next, an embodiment in which the magnetic core portion and the peripheral wall portion located in the spaces 30, 32 are held by a holding portion and the holding portion is fixed to the end-point detection sensor or the polishing table will be described with reference to FIG. 14. FIG. 14 is a schematic diagram showing an example of the configuration of the eddy current sensor 50 using the solenoid coil, and shows a fixing method for the magnetic core portion and the peripheral wall portion located in the space. FIGS. 14(A) and 14(B) show a fixing method for the magnetic core portion and the peripheral wall portion shown in FIG. 9(A), FIGS. 14(C) and 14(D) show a fixing method for the magnetic core portion and the peripheral wall portion shown in FIG. 6(A), and FIGS. 14(E) and 14(F) show a fixing method for the magnetic core portion and the peripheral wall portion shown in FIG. 10(A).

FIGS. 14(A), 14(C) and 14(E) are plan views, and FIGS. 14(B), 14(D) and 14(F) are a cross-sectional view taken along A-A of FIG. 14(A), a cross-sectional view taken along B-B of FIG. 14(C) and a cross-sectional view taken along C-C of FIG. 14(E), respectively.

In FIGS. 14(A) and 14(B), the magnetic core extension portion 8 and the peripheral wall extension portion 11 located in the space 32 are held by a holding portion 34. The material of the holding portion 34 is PP (polypropylene) resin or PEEK (polyether ether ketone) resin. The planar shape of the holding portion 34 is an elliptical shape, and the overall shape thereof is an elliptic cylinder shape. The thickness t1 of the holding portion 34 is substantially equal to the thickness t2 of the backing layer 28 shown in FIG. 9. A method of fitting the magnetic core extension portion 8 and the peripheral wall extension portion 11 to the holding portion 34 may be a method of perforating resin and fitting the magnetic core extension portion 8 and the peripheral wall extension portion 11 to holes, a method of molding the magnetic core extension portion 8 and the peripheral wall extension portion 11 with resin or other methods. The magnetic core extension portion 8, the peripheral wall extension portion 11 and the holding portion 34 which are integrated with one another are fixed to the bottom portion 61a of the eddy current sensor 50 as shown in FIG. 14(B).

In FIGS. 14(C) and 14(D), the holding portion 34 has two positioning pins 36 formed of non-magnetic material. The main body portion 4a of the eddy current sensor 50 has two holes 38 in which the positioning pins 36 are inserted. The positioning pins 36, the magnetic core extension portion 8, the peripheral wall extension portion 11 and the holding portion 34 which are integrated with one another are fixed to the holes 38 of the eddy current sensor 50 as shown in FIG. 14(D).

In FIGS. 14(E) and 14(F), the magnetic core extension portion 8, the peripheral wall extension portion 11, the metal shield 22 and the holding portion 34 which are integrated with one another are fixed to the bottom portion 61a or the base portion 6 of the eddy current sensor 50 as shown in FIG. 14(F).

Figures 15A, 15B:
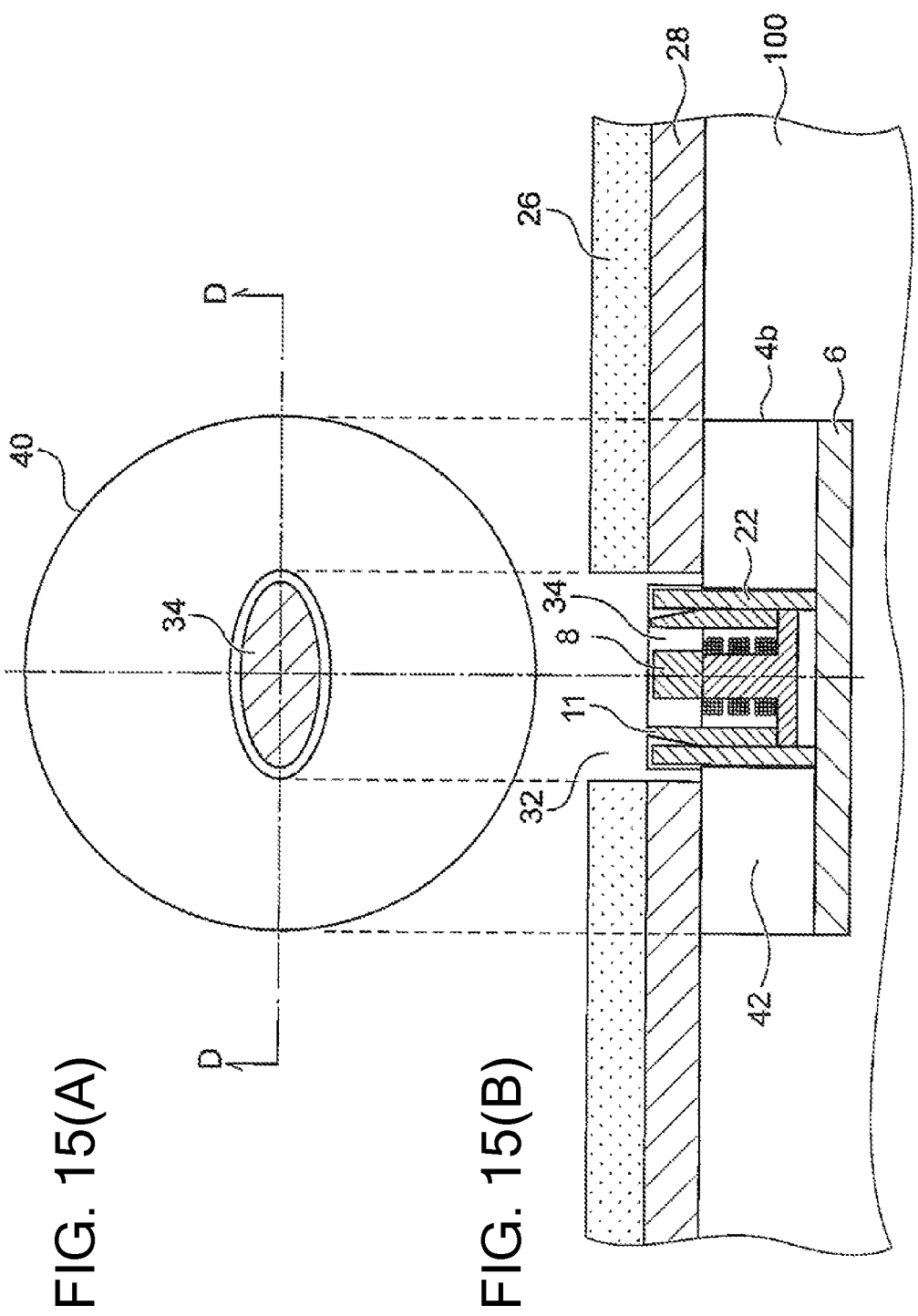
FIG. 15(A) is a plan view showing the whole of the eddy current sensor 50 shown in FIGS. 14(E) and 14(F)
FIG. 15(B) is a cross-sectional view of D-D of FIG. 15(A)

The overall eddy current sensor 50 shown in FIGS. 14(E) and 14(F) is shown in FIG. 15. FIG. 15(A) is a plan view, and FIG. 15(B) is a cross-sectional view of D-D of FIG. 15(A). A circumference 40 represents the outer diameter of the eddy current sensor 50. The outer peripheral portion 42 surrounding the outside of the metal shield 22 is filled with resin. Water or the like infiltrates into the space 32 during polishing. Therefore, a mechanism for discharging water or the like from the space 32 may be provided in the polishing table 100. The heights of the magnetic core extension portion 8, the peripheral wall extension portion 11 and the holding portion 34 may be changed according to the thickness of the polishing pad.

Figure 16A:
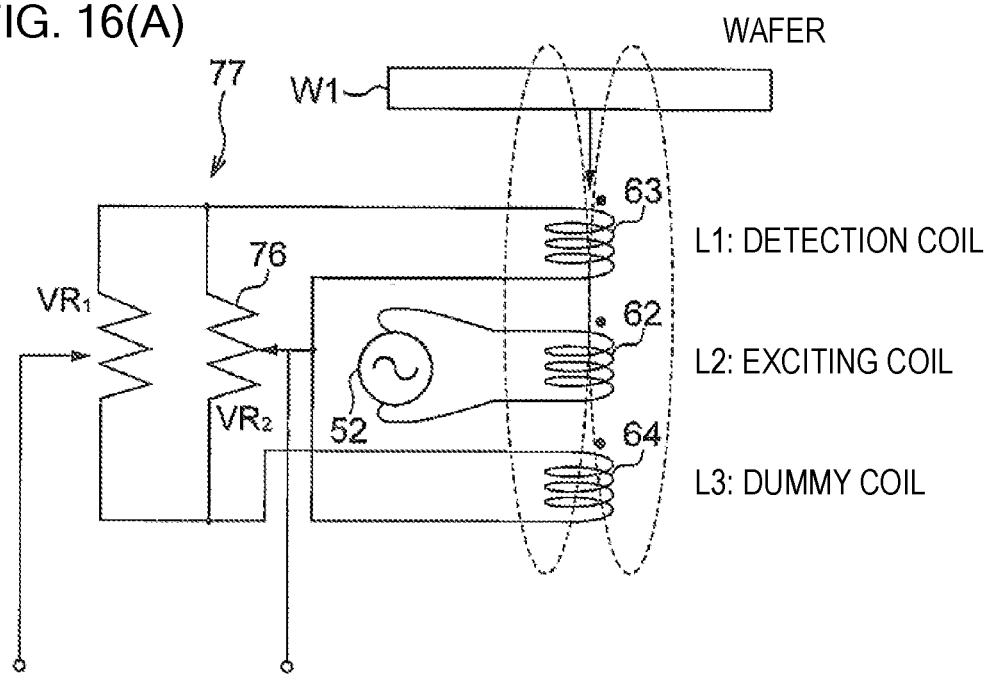
FIG. 16(A) is a schematic diagram showing a connection example of each coil in the eddy current sensor.
Figure 16B:
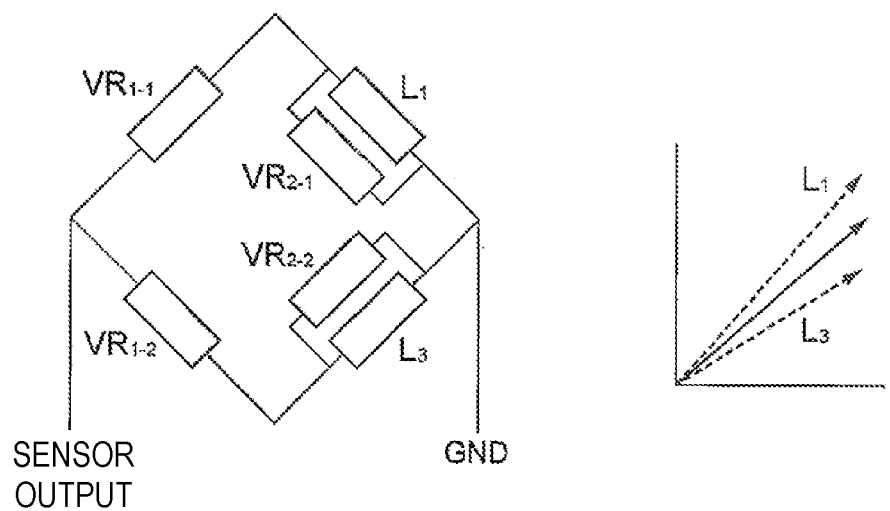
FIG. 16(B) is an equivalent circuit representation.

FIG. 16 is a schematic diagram showing connection examples of the respective coils in the eddy current sensor 50, 150. As shown in FIG. 16(A), the detection coil 63 and the dummy coil 64 are connected in opposite phases to each other.

The detection coil 63 and the dummy coil 64 constitute an opposite-phase series circuit as described above, and both the ends thereof are connected to a resistance bridge circuit 77 containing a variable resistor 76. The exciting coil 62 is connected to an AC signal source 52, and generates an alternating magnetic flux to form eddy current on a proximately disposed metal film (or electrically conductive film) mf. The resistance value of the variable resistor 76 is adjusted so that the output voltage of the series circuit comprising the coils 63, 64 is equal to zero when no metal film (or no electrically conductive film) exists. Signals $L_1$ and $L_3$ are adjusted to be in-phase by a variable resistor 76 ($VR_1$, $VR_2$) connected to coils 63 and 64 in parallel. That is, in the equivalent circuit of FIG. 16(B), the variable resistors $VR_1$ ($=VR_{1\text{-}1}+VR_{1\text{-}2}$) and $VR_2$ ($=VR_{2\text{-}1}+VR_{2\text{-}2}$) are adjusted so as to satisfy the following equation (1).

$$VR_{1\text{-}1} \times (VR_{2\text{-}2}+j\omega L_3) = VR_{1\text{-}2} \times (VR_{2\text{-}1}+j\omega L_1) \quad (1)$$

Figure 16C:
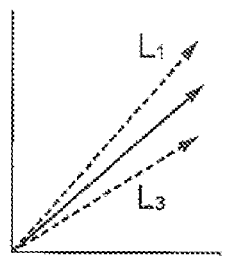
FIG. 16(C) is a graph of the signals in the coils.

Accordingly, the signals $L_1$, $L_3$ before the adjustment (represented by dotted lines in FIG. 16(C)) are set to signals having the same phase and the same amplitude (represented by a solid line in FIG. 16(C)).

When the metal film (or electrically conductive film) exists in the neighborhood of the detection coil 63, the magnetic flux generated by eddy current formed in the metal film (or electrically conductive film) interlinks across the detection coil 63 and the dummy coil 64. At this time, the detection coil 63 is arranged at a position nearer to the metal film (or electrically conductive film), and the balance between induced voltages occurring in both the coils 63 and 64 is broken, so that the interlinkage magnetic flux formed by the eddy current of the metal film (or electrically conductive film) can be detected. That is, the series circuit of the detection coil 63 and the dummy coil 64 is separated from the exciting coil 62 connected to the AC signal source, and the balance adjustment is performed by the resistance bridge circuit, whereby the zero-point adjustment can be performed. Accordingly, the eddy current flowing in the metal film (or electrically conductive film) can be detected from the zero-point state, so that the detection sensitivity of the eddy current in the metal film (or electrically conductive film) can be enhanced. Accordingly, the magnitude of the eddy current formed in the metal film (or electrically conductive film) can be detected in a broad dynamic range.

Figure 17:
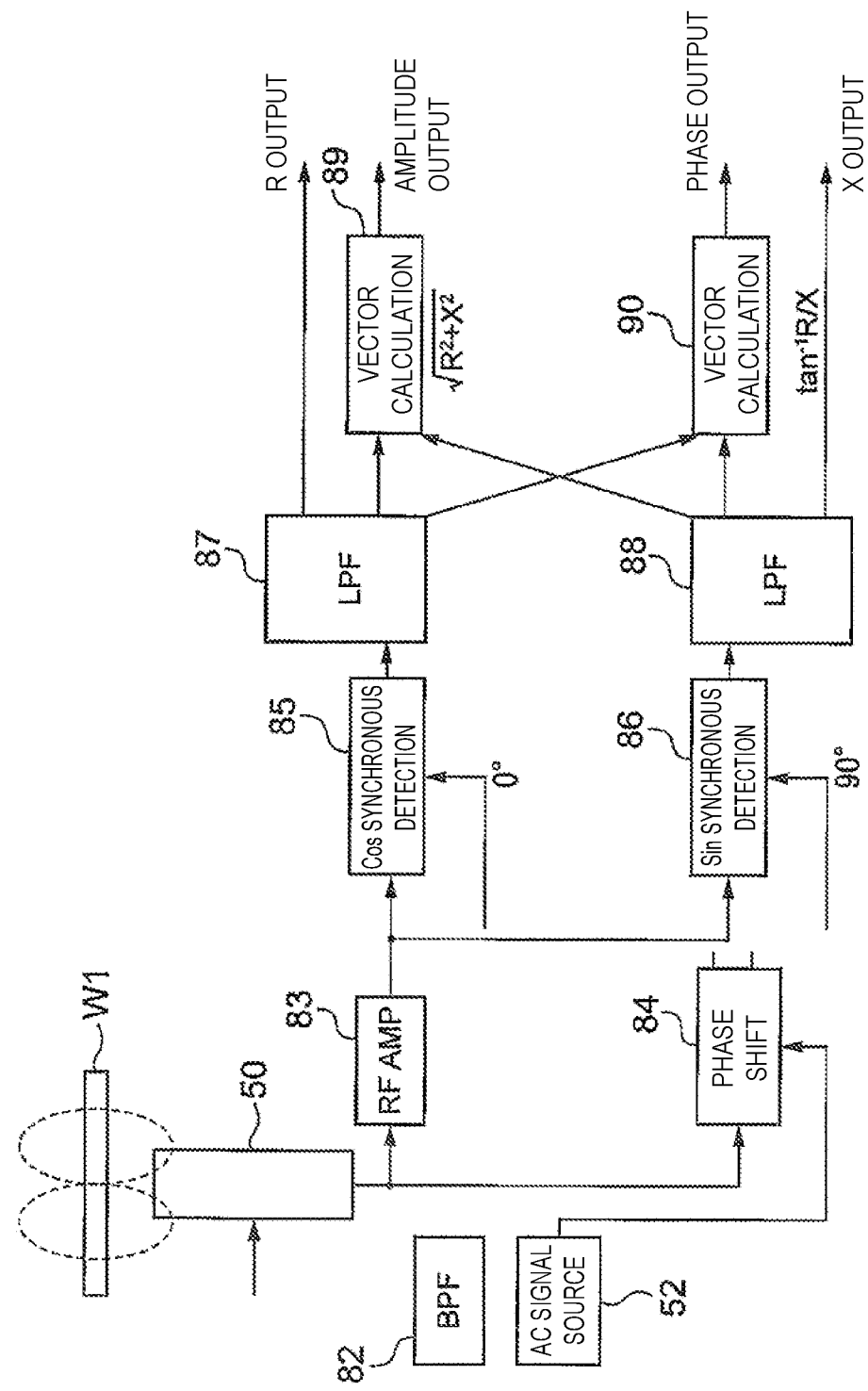
FIG. 17 is a block diagram showing a synchronization detecting circuit of the eddy current sensor.

FIG. 17 is a block diagram showing a synchronous detection circuit of the eddy current sensor 50, 150. FIG. 17 shows an example of a measurement circuit of an impedance Z when the eddy current sensor 50, 150 side is viewed from the AC signal source 52 side. In the measurement circuit of the impedance Z shown in FIG. 16, a resistance component (R), a reactance component (X), an amplitude output (Z) and a phase output ($\tan^{-1}$ R/X) which are associated with variation of the film thickness can be extracted.

As described above, the signal source 52 for supplying an AC signal to the eddy current sensors 50, 150 arranged in the neighborhood of the semiconductor wafer W1 on which the metal film (or electrically conductive film) mf as the detection target is formed is an oscillator having a fixed frequency comprising a quartz oscillator, and supplies a voltage having fixed frequencies of 2 MHz, 8 MHz, for example. An AC voltage formed in the signal source 52 is supplied to the eddy current sensors 50, 150 through a band pass filter 82. A signal detected at the terminal of the eddy current sensor 50, 150 is passed through a high frequency amplifier 83 and a phase shift circuit 84 to a synchronous detection unit comprising a cos synchronous detection circuit 85 and a sin synchronous detection circuit 86 to extract a cos component and a sin component of the detection signal. Here, two signals of an in-phase component (0°) and an orthogonal component (90°) of the signal source 52 are formed from an oscillation signal formed in the signal source 52 by the phase shift circuit 84, and then respectively introduced into the cos synchronous detection circuit 85 and the sin synchronous detection circuit 86 to perform the synchronous detection described above.

The synchronously-detected signals are passed through low pass filters 87 and 88 to remove unnecessary high frequency components which are higher than the signal components, and extract a resistance component (R) output as the cos synchronous detection output and a reactance component (X) output as the sin synchronous detection output, respectively. The amplitude output $(R^2+X^2)^{1/2}$ is obtained from the resistance component (R) output and the reactance component (X) output by a vector calculation circuit 89. The phase output ($\tan^{-1}$ R/X) is likewise obtained from the resistance component output and the reactance component output by a vector calculation circuit 90. Here, the main body of the measurement device is provided with various filters to remove noise components of the sensor signal. Cutoff frequencies which are respectively matched with the various filters are set in the various filters. For example, by setting the cutoff frequency of the low pass filter in a range from 0.1 to 10 Hz, noise components mixed in the sensor signal during polishing can be removed, and the metal film (or electrically conductive film) as a measurement target can be measured with high accuracy.

Figure 18:
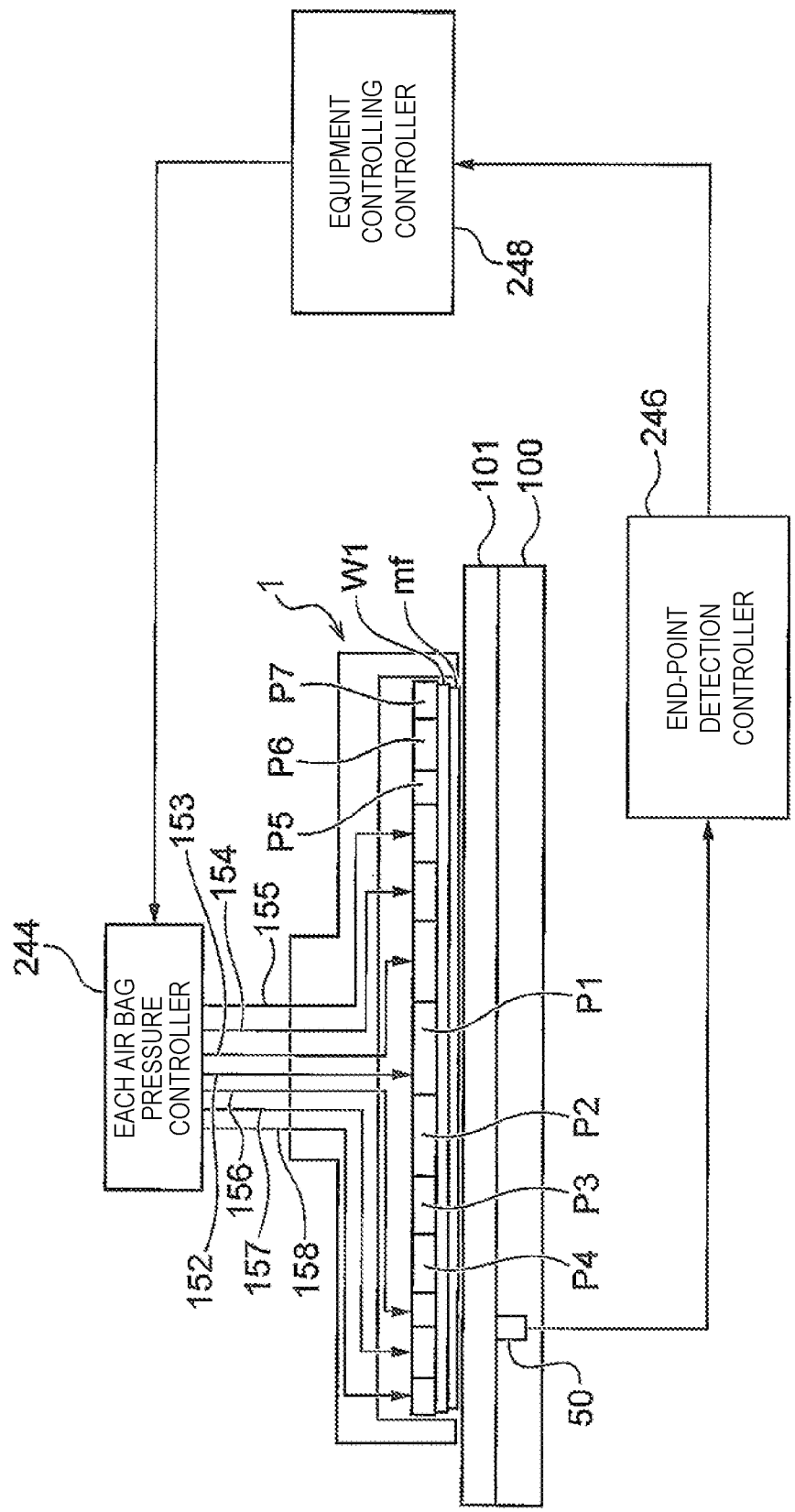
FIG. 18 is a block diagram showing a method of controlling film thickness.

In the polishing apparatus to which each of the aforementioned embodiments is applied, as shown in FIG. 18, plural pressure chambers (air bags) P1 to P7 may be provided in the space inside the top ring 1 so that the internal pressure of each of the pressure chambers P1 to P7 is adjustable. That is, the plural pressure chambers P1 to P7 are provided in the space inside the top ring 1. The plural pressure chambers P1 to P7 include a center circular pressure chamber P1 and plural annular pressure chambers P2 to P7 which are concentrically arranged at the outside of the pressure chamber P1. The internal pressure of each of the pressure chambers P1 to P7 can be changed independently by each air bag pressure controller 244, whereby the press force to each area of the substrate W at the position corresponding to each of the pressure chambers P1 to P7 can be independently adjusted.

In order to independently adjust the press force to each area, it is required to measure a wafer film thickness distribution by the eddy current sensors 50, 150. As described below, the wafer film thickness distribution can be obtained from the sensor output, the rotational number of the top ring and the rotational number of the table.

First, a track (scan line) when the surface of the semiconductor wafer is scanned by the eddy current sensors 50, 150 will be described.

According to the present invention, the rotational speed ratio between the top ring 1 and the polishing table 100 is adjusted so that tracks drawn on the semiconductor wafer W1 within a predetermined time by the eddy current sensors 50, 150 are substantially uniformly distributed over the whole surface of the semiconductor wafer W1.

Figure 19:
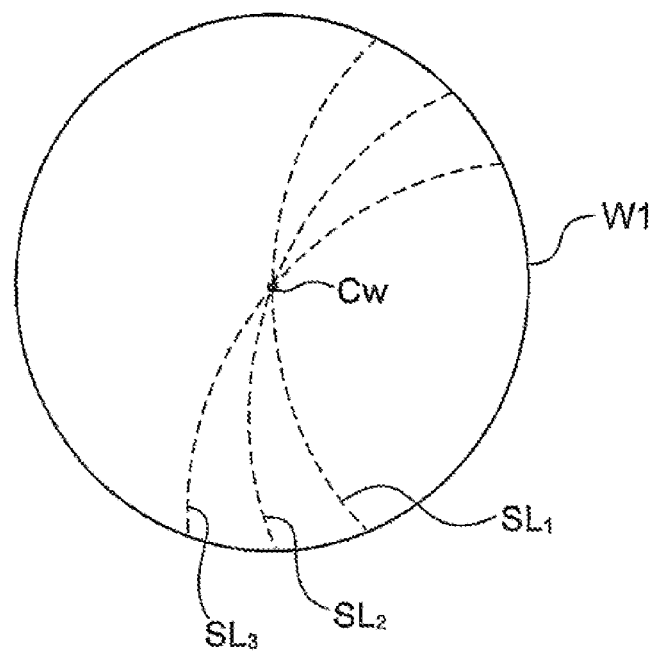
FIG. 19 is a schematic diagram showing a scanning track of the eddy current sensor on a semiconductor wafer.

FIG. 19 is a schematic diagram showing scan tracks on the semiconductor wafer W1 by the eddy current sensors 50, 150. As shown in FIG. 19, the eddy current sensors 50, 150 scan the surface (polishing target surface) of the semiconductor wafer W1 every time the polishing table 100 makes one revolution. When the polishing table 100 rotates, the eddy current sensors 50, 150 scan the polishing target surface of the semiconductor wafer W1 while drawing tracks passing over substantially the center Cw of the semiconductor wafer W1 (the center of the top ring shaft 111). By making the rotational speed of the top ring 1 and the rotational speed of the polishing table 100 different from each other, the tracks of the eddy current sensors 50, 150 on the surface of the semiconductor wafer W1 vary like scan lines $SL_1$, $SL_2$, $SL_3$, etc. with the rotation of the polishing table 100 as shown in FIG. 19. In this case, the eddy current sensors 50, 150 are arranged at such positions as to pass over the center Cw of the semiconductor wafer W1 as described above. Therefore, the tracks drawn by the eddy current sensors 50, 150 pass over the center Cw of the semiconductor wafer W1 every time.

Figure 20:
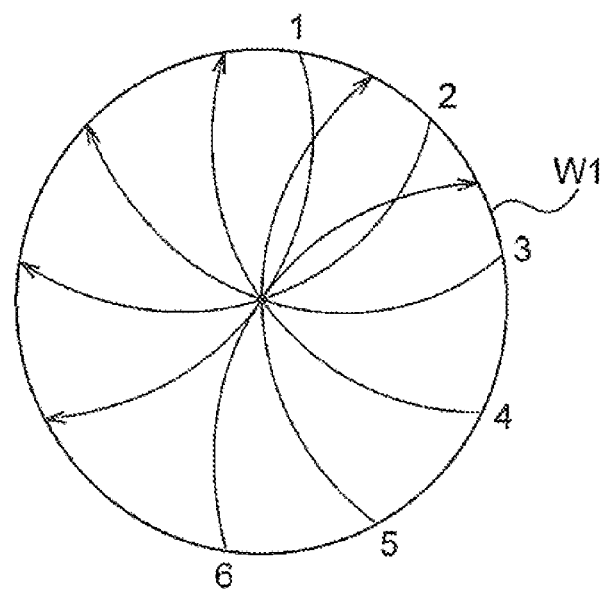
FIG. 20 is a schematic diagram showing a scanning track of the eddy current sensor on the semiconductor wafer.

FIG. 20 is a diagram showing tracks on the semiconductor wafer which are drawn by the eddy current sensors 50, 150 within a predetermined time (5 seconds in this example) when the rotational speed of the polishing table 100 is set to 70 $min^{-1}$ and the rotational speed of the top ring 1 is set to 77 $min^{-1}$. Under this condition, tracks of the eddy current sensors 50, 150 rotate by 36° every time the polishing table 100 makes one revolution as shown in FIG. 20. Accordingly, the sensor track rotates on the semiconductor wafer W1 by only half a circle every time scanning is performed five times. In consideration of the curvature of the sensor tracks, when the eddy current sensors 50, 150 scan the semiconductor wafer W1 at six times within a predetermined time, the eddy current sensors 50, 150 scan substantially equally the whole surface of the semiconductor wafer W1. The eddy current sensors 50, 150 can perform several hundreds of measurements for each track. A film thickness distribution can be determined for the whole semiconductor wafer W1 by measuring the film thickness at measurement points of 1000 to 2000, for example.

In the example described above, the rotational speed of the top ring 1 is higher than the rotational speed of the polishing table 100. However, in a case where the rotational speed of the top ring 1 is lower than the rotational speed of the polishing table 100 (for example, the rotational speed of the polishing table 100 is set to 70 $min^{-1}$ and the rotational speed of the top ring 1 is set to 63 $min^{-1}$), the sensor track is merely rotated in the opposite direction to that of the above case, and it is the same as the above case that tracks drawn by the eddy current sensors 50, 150 within a predetermined time are distributed over the whole circumference of the surface of the semiconductor wafer W1.

A method of controlling the press force to each area of the substrate W based on the obtained film thickness distribution will be described. As shown in FIG. 18, the eddy current sensor 50, 150 is connected to an end-point detection controller 246, and the end-point detection controller 246 is connected to an equipment controlling controller 248. The output signal of the eddy current sensor 50, 150 is transmitted to the end-point detection controller 246. The end-point detection controller 246 executes necessary processing (calculation processing, correction) on the output signal of the eddy current sensor 50, 150 to generate a monitoring signal (film thickness data corrected by the end-point detection controller 246). The end-point detection controller 246 operates the internal pressure of each of the pressure chambers P1 to P7 in the top ring 1 based on the monitoring signal. That is, the end-point detection controller 246 determines the force with which the top ring 1 presses the substrate W, and transmits this press force to the equipment controlling controller 248. The equipment controlling controller 248 outputs an instruction to each air bag pressure controller 244 to change the press force to the substrate W by the top ring 1. A distribution of film thicknesses of the substrate W detected by the film thickness sensor (eddy current sensor) 50 or a distribution of signals corresponding to the film thickness is accumulated in the equipment controlling controller 248. According to the distribution of the film thicknesses of the substrate W or the distribution of the signals corresponding to the film thickness which is transmitted from the end-point detection controller 246, a press condition of the substrate W for which the distribution of the film thicknesses or the distribution of the signals corresponding to the film thickness is determined by the equipment controlling controller 248 on the basis of the polishing amount to the press condition stored in a database of the equipment controlling controller 248, and transmitted to each air bag pressure controller 244.

The press condition of the substrate W is determined as follows, for example. A film thickness average value of each wafer area is calculated based on information on a wafer area whose polishing amount is affected when the pressure of each air bag is changed. The affected wafer area is determined from an experimental result or the like, and it is input in the database of the equipment controlling controller 248 in advance. The pressure to be applied to an air bag place corresponding to a wafer area whose film is thin is set to a lower value, and the pressure to be applied to an air bag place corresponding to a wafer area whose film is thick is set to a high value, whereby the air bag pressure is controlled so that the film thickness is uniform among the areas. At this time, a polishing rate may be calculated from a past film thickness distribution result, and may be set as an index for the pressure to be controlled.

The distribution of the film thicknesses of the substrate W detected by the film thickness sensor or the distribution of the signals corresponding to the film thickness may be transmitted to a superior host computer (a computer which is connected to plural semiconductor manufacturing apparatuses to manage the apparatuses), and accumulated in the host computer. According to the distribution of the film thicknesses of the substrate W or the distribution of the signals corresponding to the film thickness which is transmitted from the polishing apparatus side, the press condition of the substrate W for which the distribution of the film thicknesses or the distribution of the signals corresponding to the film thickness is detected may be determined based on the polishing amount associated with the press condition stored in the database of the host computer in the host computer, and transmitted to the equipment controlling controller 248 of the polishing apparatus concerned.

Next, the control flow of the press force to each area of the substrate W will be described.

Figure 21:
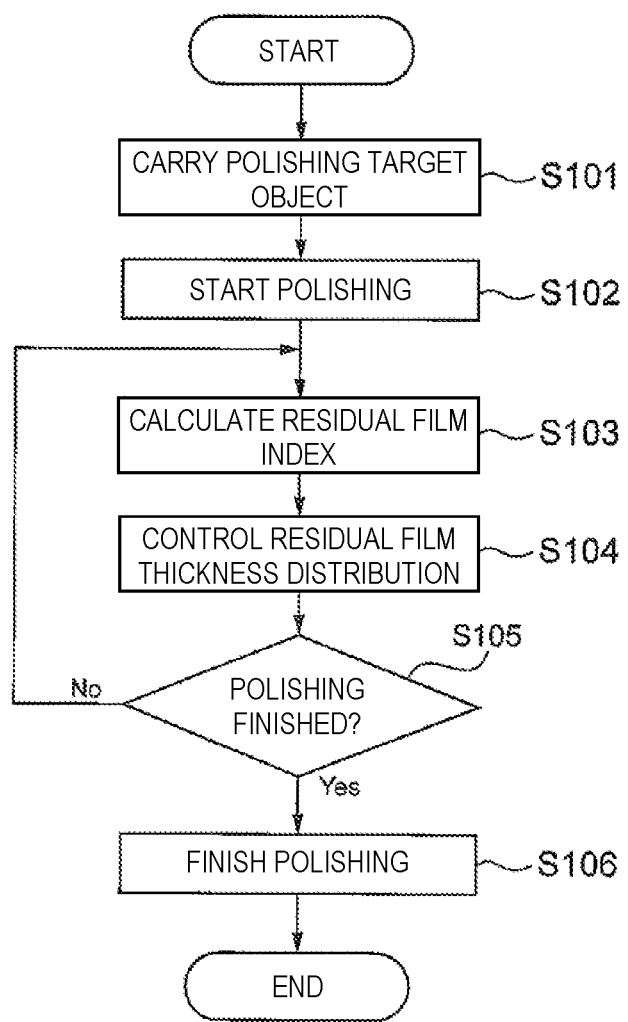
FIG. 21 is a flowchart showing an example of the operation of pressure control performed during polishing.

FIG. 21 is a flowchart showing an example of the operation of the pressure control performed during polishing. First, the polishing apparatus carries the substrate W to a polishing position (step S101). Subsequently, the polishing apparatus starts a polishing operation on the substrate W (S102).

Subsequently, the end-point detection controller 246 calculates a residual film index (film thickness data representing a residual film amount) for each area of the polishing target object during polishing of the substrate W (step S103). Subsequently, the equipment controlling controller 248 controls the distribution of the residual film thickness based on the residual film index (step S104).

Specifically, the equipment controlling controller 248 independently controls the press force to be applied to each area of the back surface of the substrate W (that is, the pressure in the pressure chambers P1 to P7) based on the residual film index calculated for each area. At an initial stage of polishing, the polishing characteristic (the polishing speed to the press force) may become unstable due to change in nature of the surface layer of the polishing target film of the substrate W or the like. In such a case, a predetermined standby time may be provided during the time from the start of polishing till execution of initial control.

Subsequently, the equipment controlling controller 248 determines based on the residual film index whether the polishing of the polishing target object should be finished or not (step S105). When the equipment controlling controller 248 determines that the residual film index does not reach a preset target value (step S105, No), it returns to the step S103.

On the other hand, when the equipment controlling controller 248 determines that the residual film index reaches the preset target value (step S105, Yes), the equipment controlling controller 248 finishes polishing of the polishing target object (step S106). In the steps S105 to 106, polishing may be finished by determining whether a predetermined time has elapsed from the start of polishing. According to this embodiment, the effective range of the output of the eddy current sensor expands to a narrow area such as an edge or the like because the spatial resolution is enhanced, and thus the number of measurement points of each area of the substrate W is increased, so that the controllability of polishing can be enhanced, and polishing flatness of the substrate can be improved.

Although the embodiments of the present invention have been described above, the described embodiments are for the purpose of facilitating the understanding of the present invention and are not intended to limit the present invention. The present invention may be modified and improved without departing from the spirit thereof, and the invention naturally includes equivalents thereof. In addition, the elements described in the claims and the specification can be arbitrarily combined or omitted within a range in which the above-mentioned problems are at least partially solved, or within a range in which at least a part of the advantages is achieved.

This application claims priority under the Paris Convention to Japanese Patent Application No. 2016-31970 filed on Feb. 23, 2016. The entire disclosure of Japanese Patent Laid-Open No. 2012-135865, Japanese Patent Laid-Open No. 2012-135862, and Japanese Patent Laid-Open No. 2013-58762 including specification, claims, drawings and summary is incorporated herein by reference in its entirety.

REFERENCE SIGNS LIST

4 Main body portion
8 Magnetic core extension portion
10 Polishing apparatus
11 Peripheral wall extension portion
12 Magnetic material core portion
16 Spiral coil
18 Magnetic material
22 Metal shield
24 Air-core portion
26 Polishing layer
28 Backing layer
30 Space
32 Space
34 Holding portion
50 Eddy current sensor
60 Pot core
62 Exciting coil
63 Detection coil
64 Dummy coil
101 Polishing pad
150 Eddy current sensor
162 Exciting coil
163 Detection coil
164 Dummy coil
61a Bottom portion
61b Magnetic core base portion
61c Peripheral wall base portion
101a Polishing surface
101b Back surface

What is claimed is:

1. A polishing apparatus comprising a polishing pad having a polishing surface for polishing a polishing target object, a polishing table to which a back surface of the polishing pad is fitted, the back surface being on an opposite side to the polishing surface, and an end-point detection sensor that is arranged in the polishing table and configured to detect an end point of the polishing, wherein the end-point detection sensor includes:

a pot core as a magnetic material having a bottom portion, a magnetic core portion arranged in a middle of the bottom portion and a peripheral wall portion arranged around the bottom portion and around the magnetic core portion;

an exciting coil that is arranged at the magnetic core portion and configured to form eddy current in the polishing target object; and a detection coil that is arranged at the magnetic core portion and configured to detect the eddy current formed in the polishing target object, and wherein a space for housing parts of the magnetic core portion and the peripheral wall portion is arranged at a portion facing the polishing table on the back surface side of the polishing pad, and the magnetic core portion and the peripheral wall portion extend from the bottom portion to the space and at least tip portions of the magnetic core portion and the peripheral wall portion extending to the space are located in the space, wherein the exciting coil and the detection coil are not arranged at the magnetic core portion in the space, and the tip portion of the peripheral wall portion has a tapered shape which has a thickness that is narrower in a direction farther away from the bottom portion to a distal end of the peripheral wall portion.

2. The polishing apparatus according to claim 1, wherein at least a part of the magnetic core portion located in the space is separable from at least a part of the magnetic core portion located in the polishing table.

3. The polishing apparatus according to claim 1, wherein at least a part of the peripheral wall portion located in the space is separable from at least a part of the peripheral wall portion located in the polishing table.

4. The polishing apparatus according to claim 1, wherein the space penetrates from the back surface of the polishing pad to the polishing surface.

5. The polishing apparatus according to claim 1, further comprising a metal shield arranged around an outer periphery of the peripheral wall portion, wherein the metal shield shields a magnetic field generated by the exciting coil.

6. A polishing apparatus comprising a polishing pad having a polishing surface for polishing a polishing target object, a polishing table to which a back surface of the polishing pad is fitted, the back surface being on an opposite side to the polishing surface, and an end-point detection sensor that is arranged in the polishing table and configured to detect an end point of the polishing, wherein the end-point detection sensor includes:
- a pot core as a magnetic material having a bottom portion and a peripheral wall portion arranged around the bottom portion;
- an exciting coil that is arranged in a middle of the bottom portion and configured to form eddy current in the polishing target object; and
- a detection coil that is an air-core coil or a coil arranged at the peripheral wall portion with the peripheral wall portion serving as a core, and is configured to detect the eddy current formed in the polishing target object, and wherein the peripheral wall portion is arranged around the exciting coil, the exciting coil is an air-core coil having an air core portion, a space for housing a part of the peripheral wall portion is arranged at a portion facing the polishing table on the back surface of the polishing pad, the peripheral wall portion extends from the bottom portion to the space, at least a tip portion of the peripheral wall portion extending to the space is located in the space, the pot core has a magnetic core portion as a magnetic material at an extension position of the air core portion that extends to the space, the magnetic core portion extends from the air core portion to the space, and at least a tip portion of the magnetic core portion extending to the space is located in the space.

7. The polishing apparatus according to claim 6, wherein at least a part of the peripheral wall portion located in the space is separable from at least a part of the peripheral wall portion located in the polishing table.

8. The polishing apparatus according to claim 1, wherein the magnetic core portion and the peripheral wall portion that are located in the space are held by a holding portion, and the holding portion is fixed to the end-point detection sensor or the polishing table.

9. The polishing apparatus according to claim 6, wherein the detection coil is arranged at the magnetic core portion or the peripheral wall portion that is located in the space.

10. The polishing apparatus according to claim 6, wherein the magnetic core portion and the peripheral wall portion that are located in the space are held by a holding portion, and the holding portion is fixed to the end-point detection sensor or the polishing table.

* * * * *